(12) United States Patent
Tomita et al.

(10) Patent No.: US 10,147,667 B2
(45) Date of Patent: Dec. 4, 2018

(54) COOLER MODULE, AND METHOD FOR MANUFACTURING COOLER MODULE

(71) Applicant: DENSO CORPORATION, Kariya, Aichi-pref. (JP)

(72) Inventors: Ryohei Tomita, Kariya (JP); Tomohiro Shimazu, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 64 days.

(21) Appl. No.: 15/509,802

(22) PCT Filed: Sep. 17, 2015

(86) PCT No.: PCT/JP2015/004757
§ 371 (c)(1),
(2) Date: Mar. 8, 2017

(87) PCT Pub. No.: WO2016/047117
PCT Pub. Date: Mar. 31, 2016

(65) Prior Publication Data
US 2017/0301610 A1    Oct. 19, 2017

(30) Foreign Application Priority Data

Sep. 23, 2014 (JP) ................................ 2014-193184
Aug. 27, 2015 (JP) ................................ 2015-168149
Aug. 31, 2015 (JP) ................................ 2015-171164

(51) Int. Cl.
*H01L 23/473* (2006.01)
*H05K 7/20* (2006.01)
(Continued)

(52) U.S. Cl.
CPC ............ *H01L 23/473* (2013.01); *F28F 3/086* (2013.01); *F28F 9/001* (2013.01);
(Continued)

(58) Field of Classification Search
CPC ............... H01L 23/473; H01L 21/4808; H01L 23/3736; H01L 25/074; H01L 25/18;
(Continued)

(56) References Cited

U.S. PATENT DOCUMENTS 8,929,097 B2 * 1/2015 Nakasaka ............. H01L 23/473
361/688
9,307,681 B2 * 4/2016 Kogure ................. F16L 41/088
(Continued)

FOREIGN PATENT DOCUMENTS

JP      2004214623 A    7/2004
JP      2005045186 A    2/2005
(Continued)

*Primary Examiner* — Justin Jonaitis
(74) *Attorney, Agent, or Firm* — Harness, Dickey & Pierce, P.L.C.

(57) ABSTRACT

A cooler module has a cooling tube and a support member. The cooling tube has a first protruding tube portion and a second protruding tube portion. The first protruding tube portion is provided with a first flexible portion formed in an annular shape. The second protruding tube portion is provided with a second flexible portion formed in an annular shape. The support member has a first fitting portion fitted to the first protruding tube portion and a second fitting portion fitted to the second protruding tube portion. The support member supports a longitudinal center portion of the cooling tube on a condition that the first protruding tube portion and the first fitting portion are fitted together, the second protruding tube portion and the second fitting portion are fitted together, and the first flexible portion and the second flexible portion are recessed toward an inside of the cooling tube.

23 Claims, 16 Drawing Sheets

(51) Int. Cl.
*F28F 3/08* (2006.01)
*F28F 9/00* (2006.01)
*H01L 21/48* (2006.01)
*H01L 23/373* (2006.01)
*H01L 25/07* (2006.01)
*H01L 25/18* (2006.01)

(52) U.S. Cl.
CPC ..... *H01L 21/4803* (2013.01); *H05K 7/20927* (2013.01); *F28F 2255/02* (2013.01); *H01L 23/3736* (2013.01); *H01L 25/074* (2013.01); *H01L 25/18* (2013.01)

(58) Field of Classification Search
CPC ........ F28F 3/086; F28F 9/001; F28F 2255/02; F28F 1/10; F28F 1/105; F28F 1/126; F28F 1/128; F28F 3/005; F28F 3/08; F28F 3/02; F28F 3/083; H05K 7/20927; F28D 1/04; F28D 9/00; F28D 1/0308; F28D 9/0006; F28D 9/0025; F28D 9/0031; F28D 9/0037; F28D 9/0062; F28D 9/0081
USPC ....... 165/152, 164, 165, 166, 167, DIG. 468
See application file for complete search history.

(56) References Cited

U.S. PATENT DOCUMENTS

| | | | |
|---|---|---|---|
| 2005/0030717 A1* | 2/2005 | Inagaki | H01L 23/4334 361/699 |
| 2005/0051298 A1* | 3/2005 | Sakai | F28F 3/12 165/80.4 |
| 2005/0133210 A1 | 6/2005 | Inagaki et al. | |
| 2006/0243422 A1* | 11/2006 | Sakai | H01L 23/473 165/80.4 |
| 2011/0299243 A1* | 12/2011 | Yamaura | H05K 7/20927 361/688 |
| 2013/0241082 A1* | 9/2013 | Okamura | H01L 23/473 257/777 |
| 2013/0335918 A1* | 12/2013 | Tachibana | H05K 5/0213 361/689 |
| 2014/0098496 A1* | 4/2014 | Nakasaka | H01L 23/473 361/699 |

FOREIGN PATENT DOCUMENTS

| | | |
|---|---|---|
| JP | 2006005014 A | 1/2006 |
| JP | 2010153527 A | 7/2010 |
| JP | 2010200478 A | 9/2010 |
| JP | 2011103728 A | 5/2011 |

* cited by examiner

COOLER MODULE, AND METHOD FOR MANUFACTURING COOLER MODULE

CROSS REFERENCE TO RELATED APPLICATIONS

This application is a U.S. National Phase Application under 35 U.S.C. 371 of International Application No. PCT/JP2015/004757 filed on Sep. 17, 2015 and published in Japanese as WO 2016/047117 A1 on Mar. 31, 2016. This application is based on and claims the benefit of priority from Japanese Patent Application No. 2014-193184 filed on Sep. 23, 2014, Japanese Patent Application No. 2015-168149 filed on Aug. 27, 2015, and Japanese Patent Application No. 2015-171164 filed on Aug. 31, 2015. The entire disclosures of all of the above applications are incorporated herein by reference.

TECHNICAL FIELD

The present disclosure relates to a cooler module that cools a cooling target, and a method for manufacturing the cooler module.

BACKGROUND ART

A power converter is known to have a cooler module and a plate part (refer to Patent Literature 1 etc.). The cooler module has cooling tubes and semiconductor modules arranged alternately. The plate part is located on one side of the cooler module in a tube stacking direction DRst.

According to the cooler module, each of the cooling tubes 2 has a longitudinal center portion, a one longitudinal end portion, and an other longitudinal end portion. The longitudinal center portion configures a heat exchange tube portion in a center portion of the cooling tube in a tube longitudinal direction DRtb. Adjacent two of the cooling tubes 2 are connected to each other by a bellows pipe 60A in the one longitudinal end portion located on one side in the tube longitudinal direction DRtb, and thereby the one longitudinal end portion configures a supply header 11A. The adjacent two of the cooling tubes 2 are connected to each other by the bellows pipe 60A in the other longitudinal end portion located on an other side in the tube longitudinal direction DRtb, and thereby the other longitudinal end portion configures a discharge header.

A plate 30C is arranged on an other side of the cooling tubes 2 in the tube stacking direction DRst. The cooling tubes 2 includes one cooling tube 2 located at an end of the cooling tubes 2 on the other side in the tube stacking direction DRst (i.e., at an other end of the cooling tubes 2 in the stacking direction). The plate 30C supports the longitudinal center portion of the one cooling tube 2. The plate 30C has a refrigerant supply path communicating with the supply header 11A and a refrigerant discharge path communicating with the discharge header.

The one cooling tube 2 (will be referred to as an end-side cooling tube 2 hereafter) located at the end of the cooling tubes 2 on the other side in the tube stacking direction DRst has the one longitudinal end portion on the one side in the tube longitudinal direction DRtb, and the one longitudinal end portion is connected to the refrigerant supply path of the plate 30C through the bellows pipe 60A. The end-side cooling tube 2 has the other longitudinal end portion on the other side in the tube longitudinal direction DRtb, and the other longitudinal end portion is connected to the refrigerant discharge path of the plate 30C through the bellows pipe 60A.

In a power conversion apparatus 1A configured in this way, the center of the end-side cooling tube 2 in the tube longitudinal direction DRtb is brought into contact with the plate 30C by shrinking the two bellows pipes 60A between the end-side cooling tube 2 and the plate 30C in the tube stacking direction DRst. Thus, the plate 30C supports the cooling tubes 2.

PRIOR ART LITERATURES

Patent Literature

Patent Literature 1: JP 2005-45186 A

SUMMARY OF INVENTION

In the power conversion apparatus 1A of Patent Literature 1, as described above, the plate 30C is in contact with the one cooling tube 2 located at the end of the cooling tubes on the one side in the tube stacking direction DRst by shrinking the two bellows pipes 60A in the tube stacking direction DRst (see FIG. 23).

The bellows pipe 60A is configured so that deformable portions 61 and 62 are arranged one by one alternately in the tube stacking direction DRst. The deformable portion 61 is formed so as to be recessed radially and inwardly around the axis of the supply header 11. The deformable portion 62 is formed so as to protrude radially and outwardly around the axis of the supply header 11. Therefore, the thickness dimension La (i.e., dimension in the tube stacking direction DRst) of the plate 30C is small in order to prevent the deformable portions 62 and 61 from interfering with the plate 30C even when the deformable portions 62 and 61 deform at the time of shrinking the bellows pipe 60A. Accordingly, the rigidity of the plate 60C is lower. On the other hand, in order to increase the thickness dimension La of the plate 30C for ensuring the rigidity of the plate 30C, the plate 30C needs to protrude to the side opposite to the cooling tube 2 (i.e., the other side in the tube stacking direction DRst). Therefore, the size of the plate 30C becomes large.

In view of the above points, it is an object of the present disclosure to provide a cooler module that ensures the rigidity of the support member supporting the cooling tube while suppressing the enlargement of the body size, and a method for manufacturing the cooler module.

A cooler module according to a first aspect of the present disclosure has a cooling tube and a support member that supports a longitudinal center portion of the cooling tube. The cooling tube has the longitudinal center portion, one longitudinal end portion, and an other longitudinal end portion. The longitudinal center portion configures a heat exchange tube portion in which a refrigerant flows. The heat exchange tube portion cools a cooling target by the refrigerant. The one longitudinal end portion configures a refrigerant introduction portion that guides the refrigerant to the heat exchange tube portion. The other longitudinal end portion configures a refrigerant discharge portion that discharges the refrigerant flowing from the heat exchange tube portion.

The one longitudinal end portion is provided with a first protruding tube portion communicating with the refrigerant introduction portion and protruding toward the support member. The other longitudinal portion is provided with a second protruding tube portion communicating with the refrigerant discharge portion and protruding toward the support member.

The first protruding tube portion has a base portion that is provided with a first flexible portion formed in an annular shape. The second protruding tube portion has a base portion that is provided with a second flexible portion is formed in an annular shape.

The support member has a first fitting portion fitted to the first protruding tube portion and a second fitting portion fitted to the second protruding tube portion. The support member supports the longitudinal center portion, on a condition that the first fitting portion and the first protruding tube portion are fitted together, the first fitting portion and the second protruding tube portion are fitted together, and the first flexible portion and the second flexible portion are recessed toward an inside of the cooling tube.

According to the first aspect, the support member supports the longitudinal center portion of the cooling tube on the condition that the first flexible portion and the second flexible portion are recessed toward the inside of the cooling tube. Therefore, the support member does not need to have a structure to avoid the flexible portions. Accordingly, a thickness of the support member can be secured without adopting the structure of the support member protruding to the side opposite to the cooling tube.

Thus, a cooler module that ensures the rigidity of the support member that supports the cooling tube can be provided while suppressing increase in the size of the structure.

A cooler module according to a second aspect of the present disclosure has cooling tubes that are stacked in a stacking direction, a first support member, and a second support member.

Every adjacent two cooling tubes of the plurality of cooling tubes have a cooling target located therebetween.

Each of the cooling tubes has a longitudinal center portion, one longitudinal end portion, and an other longitudinal end portion. The longitudinal center portion configures a heat exchange tube portion in which a refrigerant flows. The heat exchange tube portion cools the cooling target by the refrigerant. The one longitudinal end portion configures a supply header. The supply header is located between the every adjacent two cooling tubes and connects the every adjacent two cooling tubes with each other. The supply header guides refrigerant to the heat exchange tube portion of each of the every adjacent two cooling tubes. The other longitudinal end portion configures a discharge header. The discharge header is located between the every adjacent two cooling tubes and connects the every adjacent two cooling tubes with each other. The discharge header discharges the refrigerant flowing from the heat exchange tube portion of each of the every adjacent two cooling tubes.

The cooling tubes includes one cooling tube located at one end of the cooling tubes in the stacking direction and an other cooling tube located at an other end of the cooling tubes in the stacking direction. The one cooling tube has the one longitudinal end portion that is provided with a first protruding tube portion communicating with an inside of the supply header. The other cooling tube has the other longitudinal end portion that is provided with a second protruding tube portion communicating with an inside of the supply header.

The first protruding tube portion has a base portion provided with a first flexible portion. The second protruding tube portion has a base portion provided with a second flexible portion.

The first support member has a first fitting portion that is fitted to the first protruding tube portion. The second support member has a second fitting portion that is fitted to the second protruding tube portion.

The first support member supports the one cooling tube on a condition that the first protruding tube portion and the first fitting portion are fitted together and that the first flexible portion is recessed toward an inside of the one cooling tube. The second support member supports the other cooling tube on a condition that the second protruding tube portion and the second fitting portion are fitted together and that the second flexible portion is recessed toward an inside of the other cooling tube.

According to the second aspect, the first support member supports the longitudinal center portion of the one cooling tube on the condition that the first flexible portion is recessed toward the inside of the one cooling tube. Therefore, the first support member does not need to have a structure to avoid the first flexible portion. Accordingly, a thickness of the first support member can be secured without adopting the structure of the first support member protruding to the side opposite to the cooling tube.

In addition, the second support member supports the longitudinal center portion of the other cooling tube on the condition that the second flexible portion is recessed toward the inside of the other cooling tube. Thus, the second support member does not need to have a structure to avoid the second flexible portion. Accordingly, a thickness of the second support member can be secured without adopting the structure of the second support member protruding to the side opposite to the cooling tube.

Thus, a cooler module that ensures the rigidity of the first and the second support members that support the cooling tubes can be provided while suppressing an increase in the size of the structure.

A cooler module manufactured by a method for manufacturing a cooler module according to the present disclosure has a cooling tube and a support member that supports a longitudinal center portion of the cooling tube.

The cooling tube has the longitudinal center portion, one longitudinal end portion, and an other longitudinal center portion. The longitudinal center portion configures a heat exchange tube portion in which refrigerant flows. The heat exchange tube portion cools a cooling target by the refrigerant. The one longitudinal end portion configures a refrigerant introduction portion that guides the refrigerant to the heat exchange tube portion. The other longitudinal end portion configures a refrigerant discharge portion that discharges the refrigerant flowing from the heat exchange tube portion.

The one longitudinal end portion is provided with a first protruding tube portion that communicates with the refrigerant introduction portion and protrudes toward the support member. The other longitudinal end portion is provided with a second protruding tube portion that communicates with the refrigerant discharge portion and protrudes toward the support member.

The first protruding tube portion has a base portion that is provided with a first flexible portion formed in an annular shape. The second protruding tube portion has a base portion that is provided with a second flexible portion formed in an annular shape.

The support member has a first fitting portion fitting to the first protruding tube portion and a second fitting portion fitting to the second protruding tube portion.

The method for manufacturing the cooler module includes assembling and deforming.

In the assembling, the support member is assembled such that the first protruding tube portion and the first fitting portion are fitted together and that the second protruding tube portion and the second fitting portion are fitted together. In the deforming, the first flexible portion and the second flexible portion are deformed to be recessed toward an inside of the cooling tube such that the support member supports the longitudinal center portion.

According to the manufacturing method of the cooler module of the present disclosure, the support member does not need to have a structure avoiding the first and the second flexible portions. A thickness of the support member, therefore, can be secured without adopting the structure of the support member protruding to the side opposite to the cooling tube. Accordingly, the manufacturing method of the cooler module that ensures the rigidity of the support member that supports the cooling tube can be provided while suppressing an increase in the size of the structure.

Alternatively, a cooler module manufactured by a method for manufacturing a cooler module according to the present disclosure has cooling tubes that are stacked in a stacking direction, a first support member, and a second support member.

Every adjacent two cooling tubes of the cooling tubes have a cooling target located therebetween.

Each of the cooling tubes has a longitudinal center portion, one longitudinal end portion, and an other longitudinal end portion. The longitudinal center portion configures a heat exchange tube portion in which a refrigerant flows. The heat exchange tube portion cools the cooling target by the refrigerant.

The one longitudinal end portion configures a supply header. The supply header is located between the every adjacent two cooling tubes and connects the every adjacent two cooling tubes with each other. The supply header guides refrigerant to the heat exchange tube portion of each of the every adjacent two cooling tubes. The other longitudinal end portion configures a discharge header. The discharge header is located between the every adjacent two cooling tubes and connects the every adjacent two cooling tubes with each other. The discharge header discharges the refrigerant flowing from the heat exchange tube portion of each of the every adjacent two cooling tubes.

The cooling tubes includes one cooling tube located at one end of the cooling tubes in the stacking direction and an other cooling tube located at an other end of the cooling tubes in the stacking direction. The one cooling tube has the one longitudinal end portion that is provided with a first protruding tube portion communicating with an inside of the supply header. The other cooling tube has the other longitudinal end portion that is provided with a second protruding tube portion communicating with an inside of the supply header.

The first protruding tube portion has a base portion that is provided with a first flexible portion. The second protruding tube portion has a base portion that is provided with a second flexible portion.

The first support member has a first fitting portion that is fitted to the first protruding tube portion. The second support member has a second fitting portion that is fitted to the second protruding tube portion.

The method for manufacturing the cooler module includes assembling and deforming.

In the assembling, the first support member and the second support member are assembled such that the first protruding tube portion and the first fitting portion are fitted together and that the second protruding tube portion and the second fitting portion are fitted together. In the deforming, the first flexible portion and the second flexible portion are deformed to be recessed toward an inside of the one cooling tube and an inside of the other cooling tube respectively, such that the first support member and the second support member support the one cooling tube and the other cooling tube respectively.

According to this, the first support member does not need to have a structure to avoid the first flexible portion. Accordingly, the thickness of the first support member can be ensured. In addition to this, the second support member does not need to have a structure to avoid the second flexible portion. Accordingly, the thickness of the second support member can be ensured. Thus, a manufacturing method of a cooler module that ensures the rigidity of the first and the second support members that supports the cooling tubes can be provided while suppressing the size of the structure.

BRIEF DESCRIPTION OF DRAWINGS

The above and other objects, features and advantages of the present disclosure will become more apparent from the following detailed description made with reference to the accompanying drawings.

DESCRIPTION OF EMBODIMENTS

Embodiments of the present disclosure will be described hereafter referring to drawings. In the embodiments, a part that corresponds to or equivalents to a matter described in a preceding embodiment may be assigned with the same reference number. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

Figure 1:
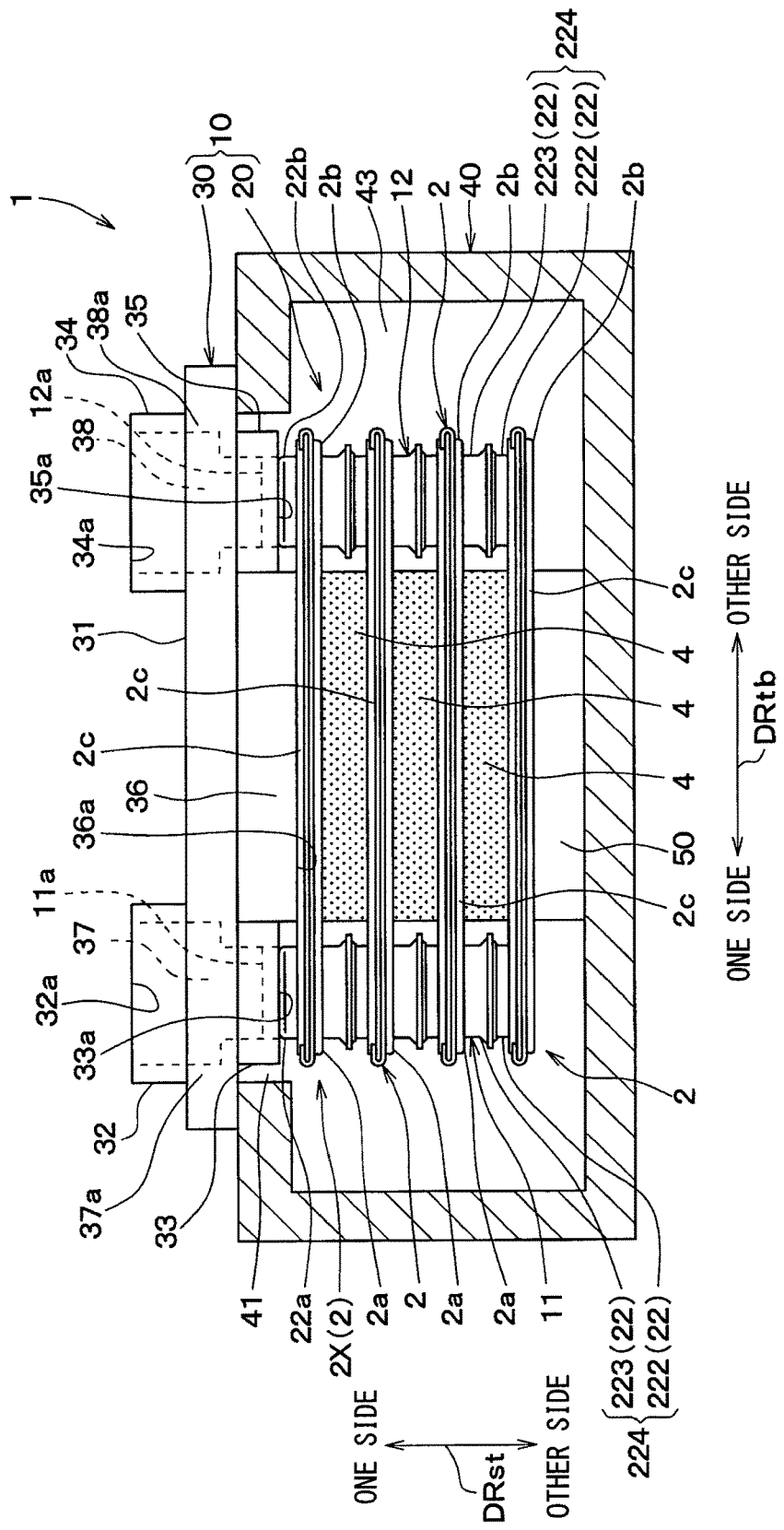
FIG. 1 is a cross-sectional view illustrating an overall configuration of a cooler module in a first embodiment.
Figure 2:
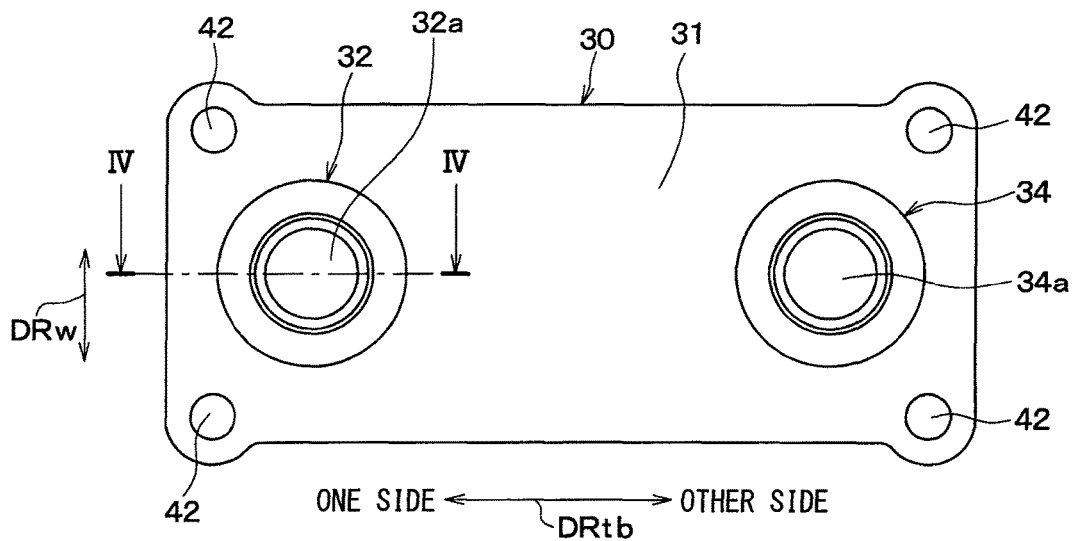
FIG. 2 is a view illustrating a plate as a single component of the cooler module in FIG. 1 as viewed from one side in a tube stacking direction DRst.

FIG. 1 is a diagram showing an overall configuration of a cooler module 1 according to the present embodiment of the present disclosure. FIG. 2 is a view illustrating the cooler module 1 as viewed from one side in a tube stacking direction DRst.

The cooler module 1 is a stacked type heat exchanger that cools a heat-exchanging object by exchanging heat between a refrigerant flowing therein and the heat-exchanging object. Specifically, the heat-exchanging object, i.e. the cooling target, is an electronic component 4 formed in a plate shape, and the cooler module 1 cools the electronic component 4 from both sides. A water mixed with ethylene glycol series antifreeze solution, i.e., a cooling water, is used as the refrigerant flowing in the cooler module 1. The tube stacking direction DRst and tube longitudinal direction DRtb in FIG. 1, and tube width direction DRw in FIG. 2 to be described later are all perpendicular to each other.

The electronic component 4 as the cooling target specifically houses a power element that controls a large power or the like and is formed in a flat rectangular parallelepiped shape. The electronic component 4 has a power electrode extending from one longer-side peripheral surface, and a control electrode extending from the other longer-side peripheral surface. In particular, the electronic component 4 is a semiconductor module with a built-in semiconductor switching element and diode. The semiconductor module configures a power converter for a driving motor of an automobile. The power converter is a circuit that outputs power to the driving motor after converting DC power to AC power.

As shown in FIG. 1, the cooler module 1 includes a cooler 10. The cooler 10 includes a body 20 and a plate 30.

The body 20 is housed in a case 40. The body 20 is configured by cooling tubes 2 stacked in the tube stacking direction DRst. Each of the cooling tubes 2 has one longitudinal end protion located on one side in the tube longitudinal direction DRtb and an other longitudinal end portion located on an other side in the tube longitudinal direction DRtb. The one longitudinal end portion configures a supply header configuring portion 2a (i.e., a refrigerant introduction portion). The other longitudinal end portion configures a discharge header configuring portion 2b (i.e., a refrigerant discharge portion). Each of the cooling tubes 2 further has a heat exchange tube portion 2c having a flat shape. The heat exchange tube portion 2c forms a tube refrigerant channel 2d, in which the refrigerant flows, between the supply header configuring portion 2a and the discharge header configuring portion 2b. The tube refrigerant channel 2d connects the supply header configuring portion 2a and the discharge header configuring portion 2b to each other.

The supply header configuring portions 2a are stacked in the tube stacking direction DRst, thereby configuring a supply header 11 that supplies the refrigerant to the tube refrigerant channel 2d. That is, the supply header 11 includes the supply header configuring portions 2a, to which the ends of the heat exchange tube portions 2c are connected respectively.

The discharge header configuring portions 2b are stacked in the tube stacking direction DRst, thereby configuring a discharge header 12 to which a refrigerant discharged from the tube refrigerant channel 2d flows. That is, the discharge header 12 includes discharge header configuring portions 2b, to which the other ends of the heat exchange tube portions 2c are connected respectively.

One flat surface (i.e., a cooling surface) of the heat exchange tube portion 2c is in contact with one main surface of the electronic component 4, and also the other flat surface (i.e., a cooling surface) of the heat exchange tube portion 2c is in contact with another main surface of a different electronic component 4.

That is, electronic components 4 and heat exchange tube portions 2c are stacked alternately in the tube stacking direction DRst. The heat exchange tube portions 2c are further disposed at both ends in the tube stacking direction DRst of an assembly formed by stacking the electronic components 4 and the heat exchange tube portions 2c. Due to such a stacking arrangement, the heat exchange tube portion 2c exchanges heat between the refrigerant that flows through the tube refrigerant channel 2d and the electronic component 4 so as to cool electronic components 4 from both sides.

The plate 30 is disposed on the one side of the body 20 in the tube stacking direction DRst. The plate 30 is a support member that supports the body 20 from the one side in the tube stacking direction DRst.

Specifically, the plate 30 includes a plate body 31, protruding open sections 32, 33, 34, and 35, a contact portion 36, and through-hole forming portions 37a and 38a.

The plate body 31 is formed in a long plate shape so as to extend in the tube longitudinal direction DRtb, and is arranged so as to close the opening 41 of the case 40. The plate body 31 is fixed to the case 40 by fastening members 42 (four fastening members 42 in FIG. 2).

The protruding open sections 32 and 33 are disposed on the one side of the plate body 31 in the tube longitudinal direction DRtb. The protruding open section 32 protrudes from the plate body 31 to the one side in the tube stacking direction DRst and forms an opening 32a. The protruding open section 33 protrudes from the plate body 31 to the other side in the tube stacking direction DRst and forms an opening 33a. The opening 32a is an opening on the one side of a through hole 37 in the tube stacking direction DRst, and the opening 33a is an opening on the other side of the through hole 37 in the tube stacking direction DRst. The through-hole forming portion 37a (i.e., a first fitting portion) configures the through hole 37 (i.e., a supply portion) penetrating the plate 30 in the tube stacking direction DRst.

The protruding open sections 34 and 35 are arranged on the other side in the tube longitudinal direction DRtb of the plate body 31. The protruding open section 34 protrudes from the plate body 31 to the one side in the tube stacking direction DRst and forms an opening 34a. The protruding open section 35 protrudes from the plate body 31 to the other side in the tube stacking direction DRst and forms an opening 35a. The opening 34a is an opening on the one side of a through hole 38 in the tube stacking direction DRst, and the opening 35a is an opening on the other side of the through hole 38 in the tube stacking direction DRst. The through-hole forming portion 38a (i.e., a second fitting portion) configures the through hole 38 (i.e., a discharge portion) penetrating the plate 30 in the tube stacking direction DRst.

The contact portion 36 is arranged between the protruding open sections 33 and 35, and is formed so as to protrude from the plate body 31 to the other side in the tube stacking direction DRst. The contact portion 36 configures a contact surface 36a that is in contact with an entirety of a longitudinal center portion of a cooling tube 2X in the tube longitudinal direction DRtb. The cooling tube 2X is one cooling tube of the cooling tubes 2 and is located at one end of the cooling tubes 2 in the tube stacking direction DRst. The plate 30 of the present embodiment is composed of a metal having a high thermal conductivity such as an aluminum alloy.

For convenience of description, in order to distinguish the one cooling tube 2 located at the one end in the tube stacking direction DRst from the other cooling tubes 2, the reference numeral "2X" is assigned to the one cooling tube 2 located at the one end in the tube stacking direction DRst.

The case 40 has openings 41 and 43. The opening 41 is made on the one side in the tube stacking direction DRst. The opening 43 is made on the one side in the tube width direction DRw (i.e., the near side in the direction perpendicular to the paper surface in FIG. 1). The case 40 of the present embodiment is a metal case having a high thermal conductivity such as an aluminum alloy.

Figure 3:
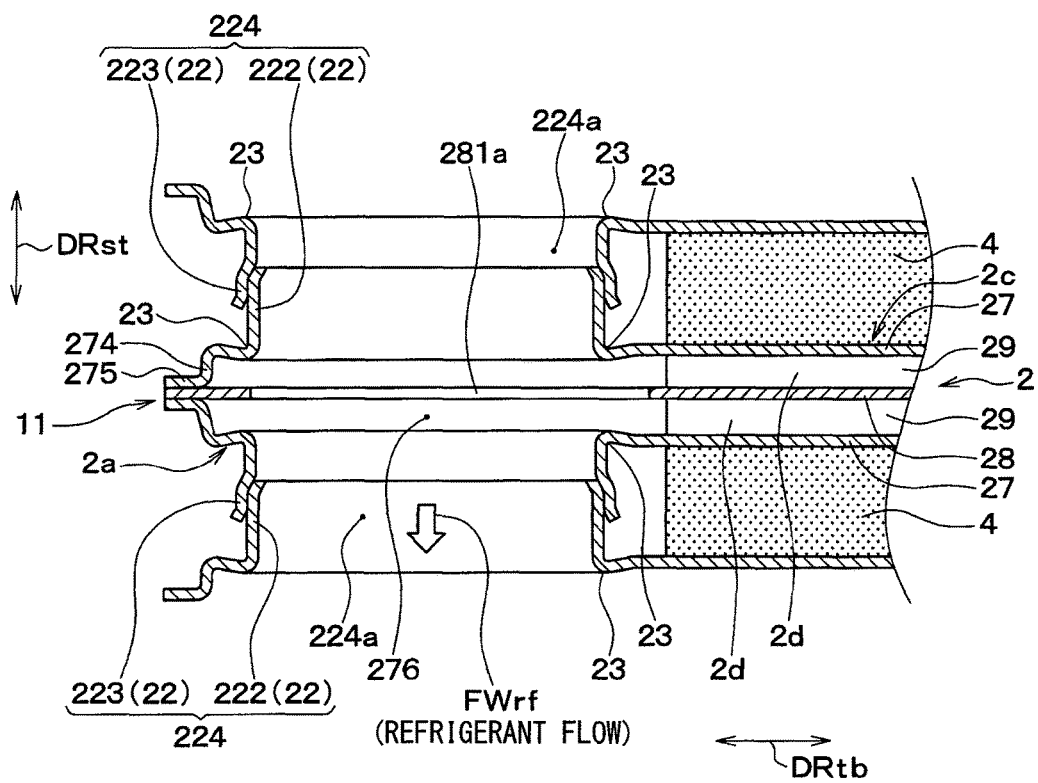
FIG. 3 is a cross-sectional view showing a vicinity of a supply header in FIG. 1.

Next, the structure of the cooling tubes 2 configuring the cooler module 1 of the present embodiment will be described in detail. FIG. 3 is a cross-sectional view showing the vicinity of the supply header 11 of the cooler module 1.

The cooling tube 2 is formed by stacking metal plates having high thermal conductivity such as an aluminum alloy and joining these plates by joining techniques such as brazing. Specifically, as shown in FIG. 3, the cooling tube 2 is configured by a pair of outer shell plates 27 and an intermediate plate 28. The pair of outer shell plates 27 forms the outer shell of the cooling tube 2 and are arranged side by side in the tube stacking direction DRst. The intermediate plate 28 is arranged between the pair of outer shell plates 27.

In other words, the heat exchange tube portion 2c is composed of the pair of outer shell plates 27 and the intermediate plate 28, and the pair of outer shell plates 27 is extended to the supply header configuring portion 2a and the discharge header configuring portion 2b. The intermediate plate 28 is extended from the inside of the heat exchange tube portion 2c to the insides of the supply header configuring portion 2a and of the discharge header configuring portion 2b.

The outer shell plate 27 has a protruding tube portion 22 provided so as to protrude in the tube stacking direction DRst on the parts configuring the supply header configuring portion 2a and the discharge header configuring portion 2b. The protruding tube portion 22 has an opening in the tube stacking direction DRst. The cooling tubes 2 are coupled together in the tube stacking direction DRst by joining the protruding tube portions 22 together, and thereby the supply header 11 and the discharge header 12 are configured.

Further, the outer shell plate 27 has a diaphragm 23 formed in an annular shape with a predetermined radial width around the base of the protruding tube portion 22, i.e. in the base portion of the protruding tube portion 22. That is, the diaphragm 23 is provided with the base portion of the protruding tube portion 22 of the cooling tube 2. The diaphragm 23 is recessed toward the inside of each of the supply header configuring portion 2a and the discharge header configuring portion 2b in the supply header configuring portion 2a and the discharge header configuring portion 2b.

The diaphragm 23 of the present embodiment configures an flexible portion which can be easily deformed by pressing force in the tube stacking direction DRst at the time of assembling the cooler module 1. The diaphragm 23 has a low rigidity as compared with the portion other than the diaphragm 23 in the supply header 11 (or discharge header 12). That is, the diaphragm 23 has a low rigidity as compared with the end of the protruding tube portion 22 and the cooling tube 2.

In addition, the protruding tube portion 22 of the outer shell plate 27 is subjected to spigot connection. That is, one protruding tube portion 22 of the two protruding tube portions 22 connected in the tube stacking direction DRst is a stepped large-diameter protruding tube portion 223 disposed outside for the spigot connection, and the other protruding tube portion 22 is a small-diameter protruding tube portion 222 that is inserted and disposed inside the large-diameter protruding tube portion 223. Thus, one of the pair of outer shell plates 27 configuring a cooling tube 2 has the large-diameter protruding tube portion 223 as the protruding tube portion 22, and the other of the pair of outer shell plates 27 has the small-diameter protruding tube portion 222 as the protruding tube portion 22.

In each of the supply header 11 and the discharge header 12, the small-diameter protruding tube portion 222 is fitted into the large-diameter protruding tube portion 223 so that the small-diameter protruding tube portion 222 and the large-diameter protruding tube portion 223 configure a conduit configuring portion 224. The conduit configuring portion 224 forms a tank conduit 224a that has a circular-tube shape and guides a refrigerant to flow into the tube stacking direction DRst in each of the supply header 11 and the discharge header 12.

That is, the one end portions of every adjacent two of the cooling tubes 2 in the tube longitudinal direction DRtb are connected to each other through single conduit configuring portion 224 and configure the supply header 11.

The other longitudinal end portions of every adjacent two of the cooling tubes 2 in the tube longitudinal direction DRtb are connected to each other through single conduit configuring portion 224 and configure the discharge header 12.

As shown in FIG. 3, the large-diameter protruding tube portion 223 accepts the small-diameter protruding tube portion 222 entering the inside thereof. The step formed on the large-diameter protruding tube portion 223 functions as a restricting portion that restricts the insertion length of the small-diameter protruding tube portion 222. The end of the small-diameter protruding tube portion 222 comes in contact with the step, and thus the insertion length of the small-diameter protruding tube portion 222 in the axial direction, that is, the tube stacking direction DRst is restricted. A void is provided between the inner surface of the large-diameter protruding tube portion 223 and the outer surface of the small-diameter protruding tube portion 222. Although the void is large enough to allow the insertion in the assembling process, the protruding tube portions are joined together by brazing, and the void is closed to be sealed.

The protruding tube portion 22 after the joining provides a degree of rigidity that does not cause buckling even under a pressure large enough to plastically deform the diaphragm 23 in the axial direction or the tube stacking direction DRst.

On the outer edge of the outer shell plate 27, an outer peripheral wall surface 274 rising in the tube stacking direction DRst and a flange 275 having a narrow width extending from the outer peripheral wall surface 274 to the outside are formed as shown in FIG. 3. The flange 275 provides a plane extending in a direction perpendicular to the array direction.

A pair of outer shell plates 27 is arranged such that the flanges 275 face each other and that the edge of the intermediate plate 28 is held between the flanges 275. A pair of outer shell plates 27 and the intermediate plate 28 are joined by brazing.

As described above, the protruding tube portions 22 of the cooling tubes 2 adjoining each other are fitted together and the side walls of the protruding tube portions 22 are joined together so as to communicate between the supply header configuring portions 2a and to communicate between the discharge header configuring portions 2b. Thus, the supply header 11 and the discharge header 12 are formed.

Figure 4:
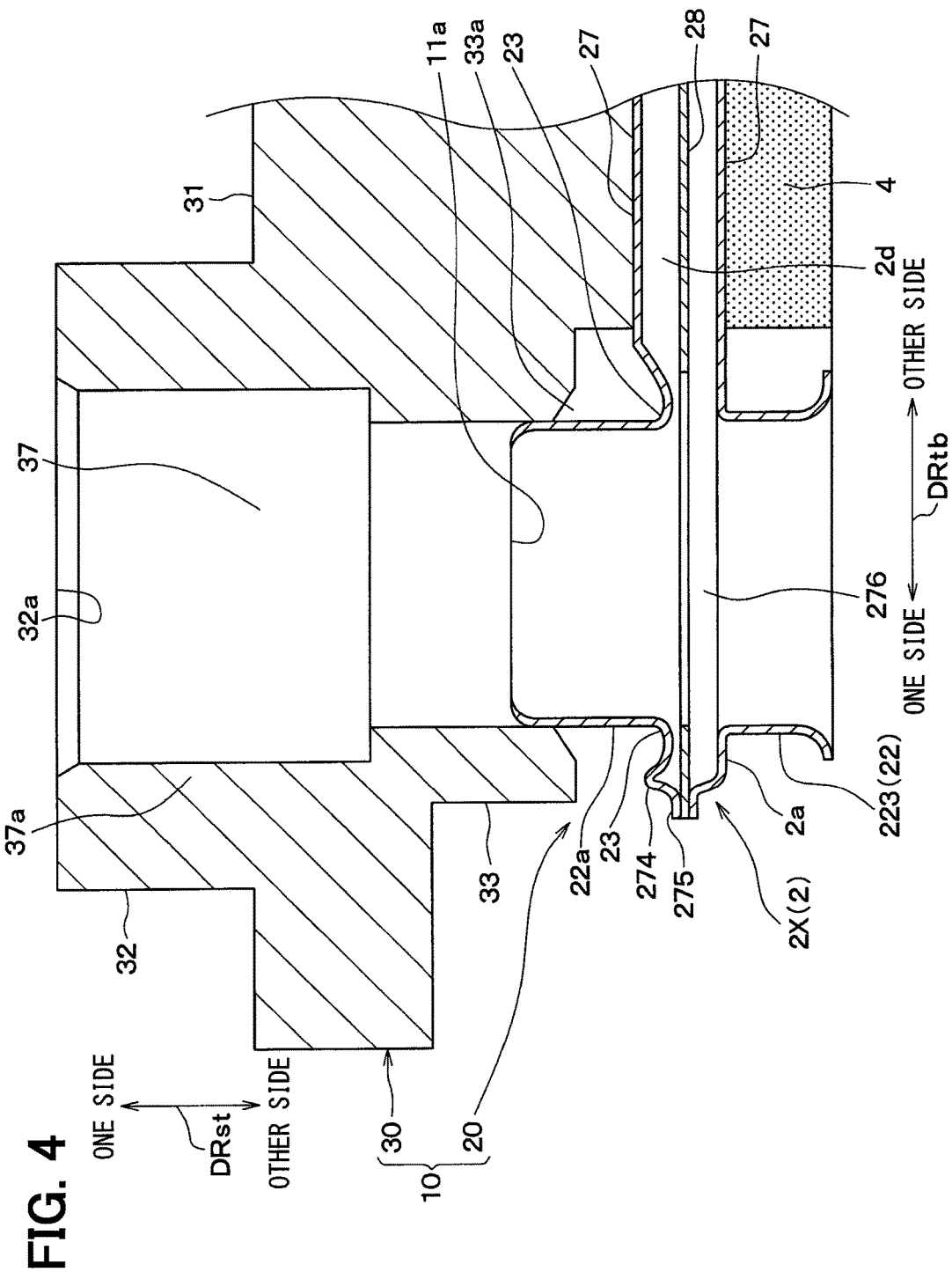
FIG. 4 is a cross-sectional view showing the supply header and the plate in FIG. 1.

In the present embodiment, protruding tube portions 22a and 22b provided with the cooling tube 2X located on the one end of the cooling tubes 2 in the tube stacking direction DRst are respectively fitted into the through holes 37 and 38 of the plate 30 (see FIG. 4). Each of the protruding tube portions 22a and 22b is a protruding tube portion that protrudes from the cooling tube 2X on the one side toward the one side in the tube stacking direction DRst.

Here, the protruding tube portion 22a is a protruding tube portion configuring a refrigerant inlet 11a of the supply header 11, and the protruding tube portion 22b is a protruding tube portion configuring a refrigerant outlet 12a of the discharge header 12. Therefore, the protruding tube portions 22a and 22b are denoted to be distinguished by different reference numerals for convenience of description.

The diaphragm 23 is provided with the base portion of the protruding tube portion 22a of the cooling tube 2X. The diaphragm 23 has a low rigidity as compared with the portions other than the diaphragm 23 in the cooling tube 2X and the protruding tube portion 22a and is configured to be easily deformable.

The diaphragm 23 is provided with the base portion of the protruding tube portion 22b of the cooling tube 2X. The diaphragm 23 has a low rigidity as compared with the portions other than the diaphragm 23 of the cooling tube 2X and the protruding tube portion 22b and is configured to be easily deformable.

As shown in FIG. 1, the cooler module 1 has one outer shell plate of the outer shell plates 27 (refer to FIG. 5) located at the other end in the tube stacking direction DRst, and the one outer shell plate has no protruding tube portion 22 and is closed. That is, an other cooling tube of the cooling tubes 2 located at the other end in the tube stacking direction DRst has no protruding tube portion 22 on the other side in the tube stacking direction DRst.

Figure 5:
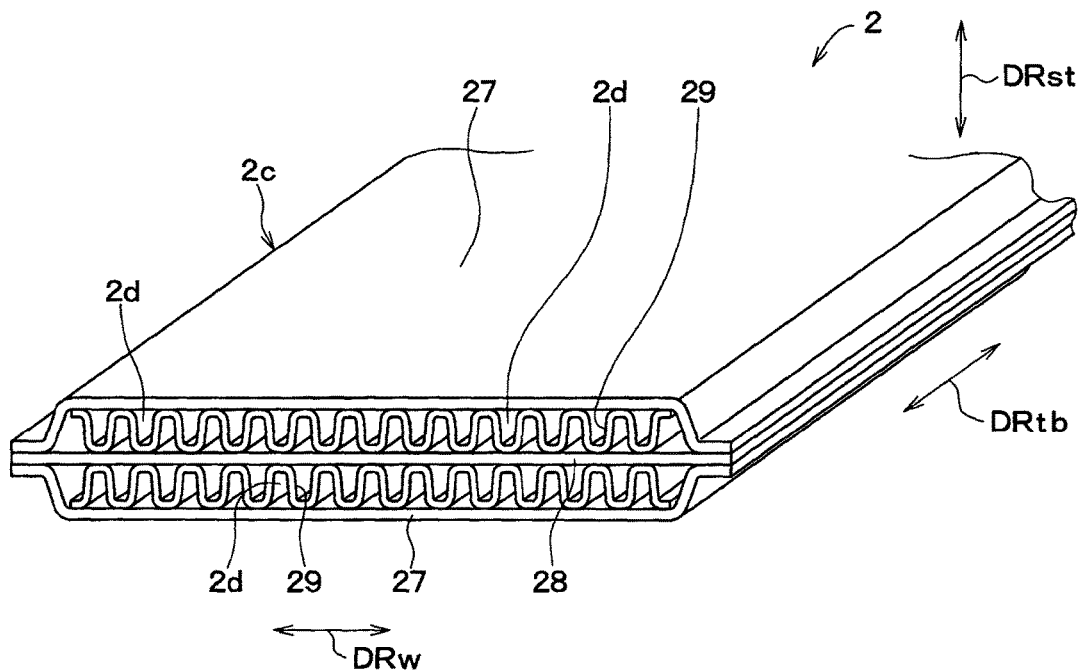
FIG. 5 is a view showing an intermediate plate and an inner fin attached to the intermediate plate of FIG. 1.

Further, as shown in FIG. 5 that is a perspective view illustrating a heat exchange tube portion 2c, the cooling tube 2 has a pair of inner fins 29 stacked in the tube stacking direction DRst so that the intermediate plate 28 is held between the pair of inner fins 29 at the portion configuring the heat exchange tube portion 2c. The inner fin 29 is arranged between the intermediate plate 28 and the outer shell plate 27 and is formed into a wave shape to promote heat exchange of the refrigerant. In other words, a tube refrigerant channel 2d is formed between the intermediate plate 28 and the outer shell plate 27 in the heat exchange tube portion 2c, and the inner fin 29 is disposed within the tube refrigerant channel 2d. The outer shell plate 27, the intermediate plate 28, and the inner fin 29 are joined together by being brazed to configure a cooling tube 2.

Next, a description will be given of the operation of the cooler module 1 of the present embodiment.

First, a refrigerant from the through hole 37 of the plate 30 is supplied to the supply header 11 through the protruding tube portion 22a of the cooling tube 2X. The supplied refrigerant is distributed from the header 11 to each of the heat exchange tube portions 2c. After having passed through each of the heat exchange tube portions 2c, the distributed refrigerant is collected in the discharge header 12. The collected refrigerant is discharged into the through hole 38 of the plate 30 through the protruding tube portion 22b of the cooling tube 2X. As the refrigerant flows in this way, each of the electronic components 4 is cooled by the refrigerant in the corresponding two heat exchange tube portions 2c of the heat exchange tube portions 2c.

Figure 6:
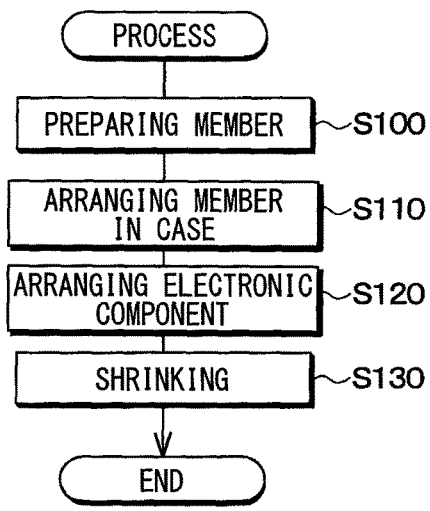
FIG. 6 is a flow chart showing manufacturing processes of the cooler module in the first embodiment.

The assembly of the cooler module 1 of the present embodiment will be described with reference to FIG. 6.

First, in a first process, the cooling tubes 2, plate 30, and the electronic components 4 are prepared separately. Next, the cooling tubes 2 are stacked in the tube stacking direction DRst.

Every adjacent two of the cooling tubes 2 are coupled with each other in a manner that the protruding tube portion (i.e., a third protruding tube portion) 22, which is provided with the one end portion of one of the adjacent two of the cooling tubes 2 in the tube longitudinal direction DRtb, and the protruding tube portion (i.e., a fourth protruding tube portion) 22, which is provided with the one end portion of the other of the adjacent two of the cooling tubes 2 in the tube longitudinal direction DRtb, are fitted together.

Similarly, the protruding tube portion (i.e., the third protruding tube portion) 22, which is provided with the other end portion of the one of the adjacent two of the cooling tubes 2 in the tube longitudinal direction DRtb, and the protruding tube portion (i.e., the fourth protruding tube portion) 22, which is provided with the other end portion of the other of the adjacent two of the cooling tubes 2 in the tube longitudinal direction DRtb, are fitted together.

The cooling tube 2X of the cooling tubes 2 located at one end of the cooling tubes 2 in the tube stacking direction DRst is provided with a protruding tube portion (i.e., a first protruding tube portion) 22a and a protruding tube portion (i.e., a second protruding tube portion) 22b. The protruding tube portion 22a is fitted in the opening 33a of the protruding open section 33 provided in the plate 30, and the protruding tube portion 22b is fitted in the opening 35a of the protruding open section 35 provided in the plate 30.

Furthermore, the cooling tubes 2 and the plate 30 are integrated together by joining techniques such as brazing.

For example, every adjacent two of the cooling tubes 2 are coupled with each other in a manner that the protruding tube portion 22, which is provided with the one end portion of the one of the adjacent two of the cooling tubes 2 in the tube longitudinal direction DRtb, and the protruding tube portion 22, which is provided with the one end portion of the other of the adjacent two of the cooling tubes 2 in the tube longitudinal direction DRtb, are joined by a joining technique such as brazing. Thus, the supply header 11 is configured.

Similarly, the protruding tube portion 22, which is provided with the other end portion of the one of the adjacent two of the cooling tubes 2 in the tube longitudinal direction DRtb, and the protruding tube portion 22, which is provided with the other end portion of the other of the adjacent two of the cooling tubes 2 in the tube longitudinal direction DRtb, are joined by a joining technique such as brazing. Thus, the discharge header 12 is configured.

The protruding tube portion 22a of the cooling tube 2X and the protruding open section 33 of the plate 30 are joined by joining techniques such as brazing. In addition, the protruding tube portion 22b of the cooling tube 2X and the protruding open section 35 of the plate 30 are joined by joining techniques such as brazing.

Thus, the body 20 before the diaphragm 23 is deformed and the plate 30 are integrated (S100).

Then, the body 20 is housed in the case 40 in a second process. At this time, the plate 30 is assembled to the case 40 such that the plate 30 covers the opening 41 of the case 40. In addition, an elastic member 50 such as a spring is arranged between the bottom of the case 40 and the cooler 10 (S110). Thus, the cooler 10 is supported by the bottom of the case 40 through the elastic member 50.

Subsequently, in a third process, the electronic component 4 is inserted from a side adjacent to the opening 43 to be arranged between adjacent two of the heat exchange tube portions 2c (S120), such that every adjacent two of the heat exchange tube portions 2c of the cooler 10 have the electronic component 4 located therebetween.

In the third process, the fastening members 42 are fastened to the case 40 through the plate body 31. At this time, the body 20 is held between the plate 30 and the bottom of the case 40, and thereby pressing force applied by a tool such as a screwdriver to the fastening members 42 transmits to the body 20 through the plate body 31.

This pressing force shrinks the cooler 10 in the tube stacking direction DRst. Specifically, the pressing force is given to the diaphragm 23 of each outer shell plate 27 through the protruding tube portion 22. Therefore, the diaphragms 23 of each outer shell plate 27 are respectively recessed toward the inside of the supply header configuring portion 2a and the discharge header configuring portion 2b by the pressing force on the supply header configuring portion 2a and the discharge header configuring portion 2b.

Figure 8:
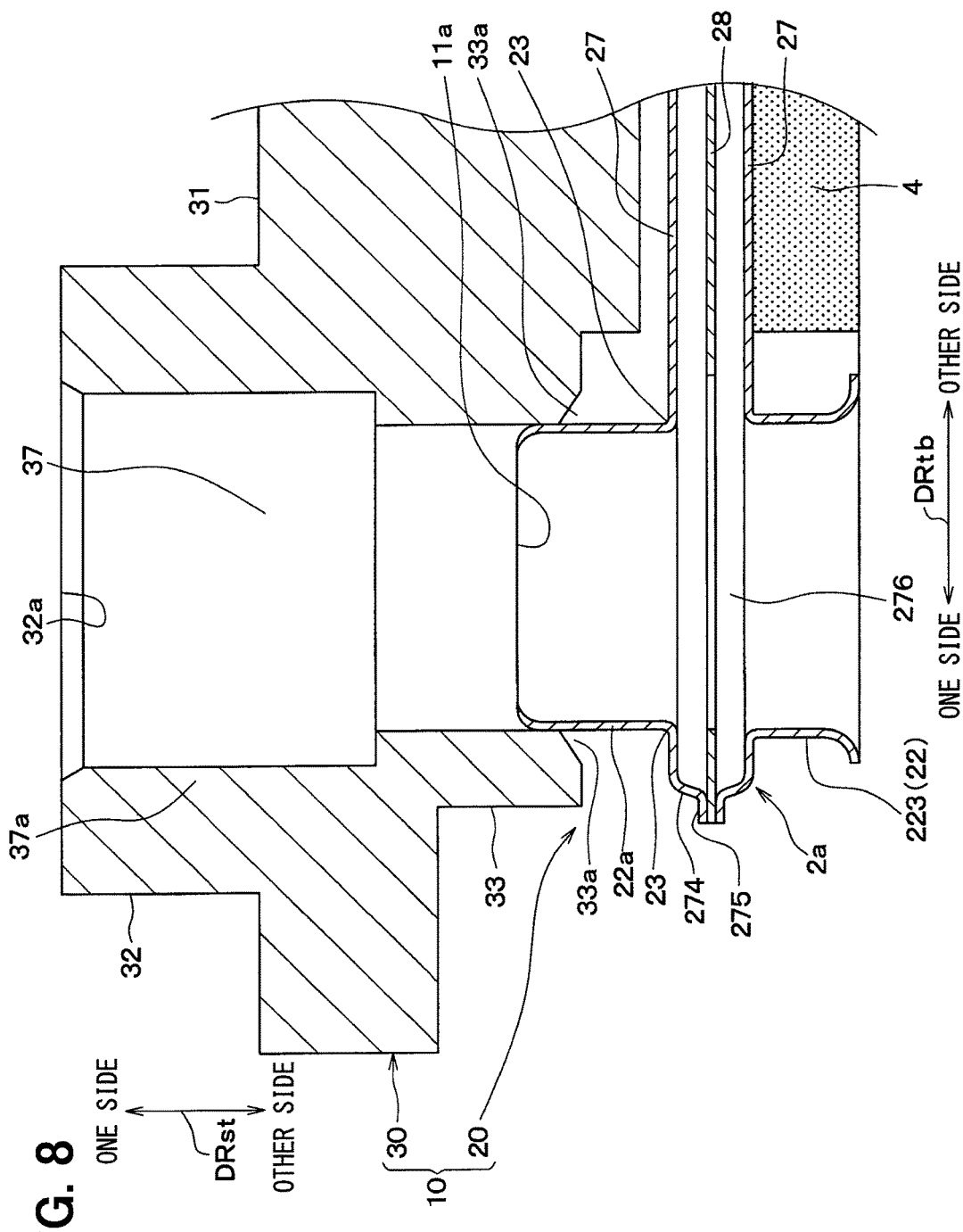
FIG. 8 is a cross-sectional view showing the supply header and the plate before deformation in FIG. 1.

For example, the cooling tube 2X of the cooling tubes 2 located at the one end in the tube stacking direction DRst is provided with the protruding tube portions 22a, 22b that have the base portions provided with the diaphragms 23 (i.e., a first flexible portion and a second flexible portion) respectively. The diaphragms 23 are deformed from the state shown in FIG. 8 to the state shown in FIG. 4 by pressing force and recessed toward the inside of the cooling tube 2X. As a result, the contact surface 36a of the contact portion 36 provided with the plate 30 is in contact with the longitudinal center portion (i.e., the heat exchange tube portion 2c) of the cooling tube 2X that is a center portion in the tube longitudinal direction DRtb. Thus, the contact surface 36a supports the longitudinal center portion of the cooling tube 2X.

Figure 7:
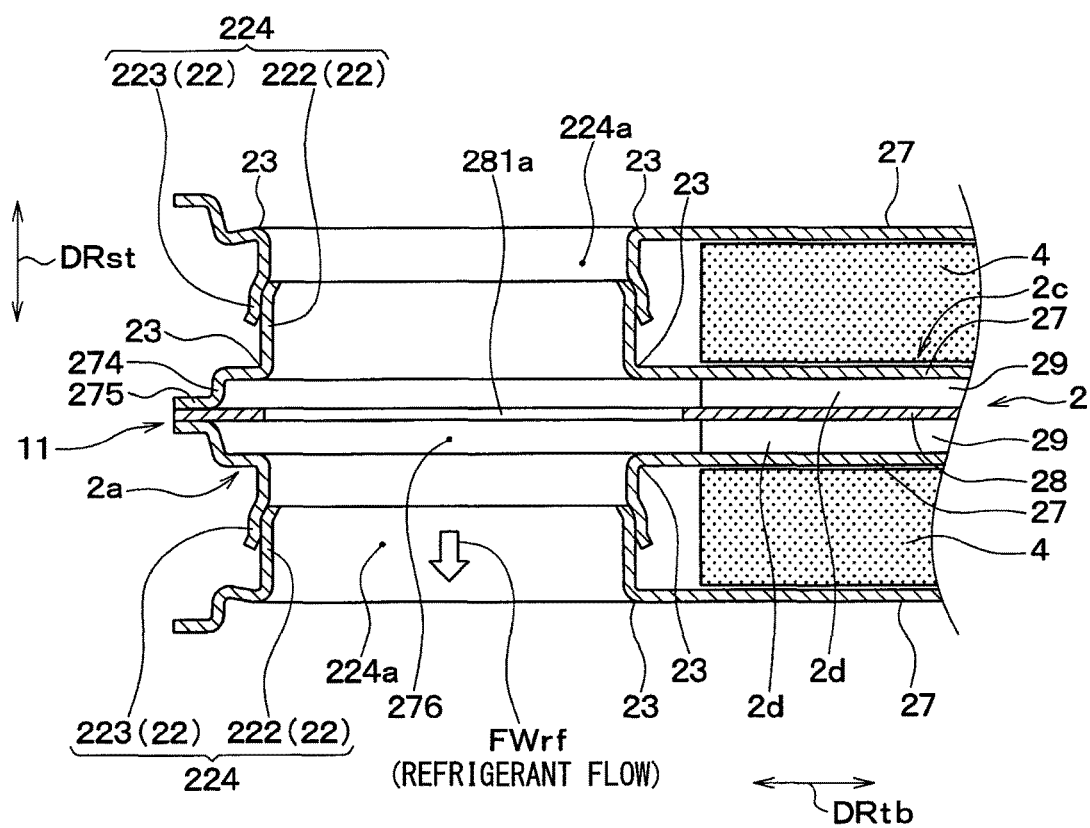
FIG. 7 is a cross-sectional view showing the vicinity of the supply header before deformation in FIG. 1.

Each of every adjacent two of the cooling tubes 2 has the one end portion in the tube longitudinal direction DRtb, and the one end portion is provided with the protruding tube portion 22 that has a base portion provided with the diaphragm 23 (i.e., the fifth flexible portion and the seventh flexible portion). Similar to Patent Literature 1, the diaphragm 23 is recessed toward the inside of the cooling tube 2 by deforming from a state shown in FIG. 7 to a state shown in FIG. 3 due to pressing force.

Similarly, each of every adjacent two of the cooling tubes 2 has the other end portion in the tube longitudinal direction DRtb, and the other end portion is provided with the protruding tube portion 22 that has a base portion provided with the diaphragm 23 (i.e., the sixth flexible portion and the eighth flexible portion). The diaphragm 23 is recessed toward the inside of the cooling tube 2 by deforming from the state shown in FIG. 7 to the state shown in FIG. 3 due to pressing force. In this case, a dimension between the adjacent two of the cooling tubes 2 (i.e., between adjacent two of the heat exchange tube portions 2c) is decreased. Accordingly, the electronic component 4 is tightly in contact with each of the adjacent two of the heat exchange tube portions 2c (S130). As a result, pressing force is applied to the cooler 10 from the elastic member 50 in the tube stacking direction DRst between the elastic member 50 and the plate body 31. Thus, the assembly of the cooler module 1 is completed.

According to the above-described present embodiment, the cooler module 1 has the tubes 2 and the plate 30. The plate 30 supports the longitudinal center portion of the cooling tube 2X that is the one cooling tube of the cooling tubes 2 and is located at the one end in the tube stacking direction DRst.

The one longitudinal end portion of the cooling tube 2X, which is located on the one side in the tube longitudinal direction DRtb, configures the supply header configuring portion 2a that guides the refrigerant to the refrigerant channel 2d. The other longitudinal end portion of the cooling tube 2X, which is located on the other side in the tube longitudinal direction DRtb, configures the discharge header configuring portion 2b that discharges the refrigerant flowing from the refrigerant channel 2d.

The longitudinal center portion of the cooling tube 2X, which is a center portion in the tube longitudinal direction DRtb, configures the heat exchange tube portion 2c that cools the electronic component 4 by using the refrigerant flowing in the refrigerant channel 2d. The one longitudinal end portion of the cooling tube 2X in the tube longitudinal direction DRtb communicates with the supply header configuring portion 2a and is provided with the protruding tube portion 22a (i.e., the first protruding tube portion) protruding toward the through hole 37 of the plate 30. The other longitudinal end portion of the cooling tube 2X in the tube longitudinal direction DRtb communicates with the discharge header configuring portion 2b and is provided with the protruding tube portion 22b (i.e., the second protruding tube portion) protruding toward the through hole 38 of the plate 30.

The protruding tube portion 22a and the protruding tube portion 22b of the cooling tube 2X have the base portions respectively, and the base portions are respectively provided with the diaphragms 23 (i.e., a first flexible portion and a second flexible portion) formed in the annular shape. The plate 30 is in contact with the longitudinal center portion of the cooling tube 2X and supports the longitudinal center portion of the cooling tube 2X, on a condition that the protruding tube portions 22a, 22b are fitted into the through holes 37, 38 of the plate 30 respectively and that the diaphragms 23 are recessed toward the inside of the cooling tube 2X.

Accordingly, the plate 30 supports the longitudinal center portion of the cooling tube 2X in the tube longitudinal direction DRtb on a condition that the diaphragms 23, which are respectively provided in the base portions of the protruding tube portions 22a, 22b provided with the cooling tube 2X, are recessed toward the inside of the cooling tube 2X. Therefore, the plate 30 does not need to be configured to avoid diaphragm 23. Accordingly, a sufficient thickness dimension La of the plate 30 can be secured without protrusion of the plate 30 to the side opposite to the cooling tube 2X (i.e., protrusion of the plate 30 to the one side in the tube stacking direction DRst). Thus, the cooler module 1 capable of securing the rigidity of the plate 30 for supporting the cooling tube 2 and a manufacturing method of the cooler module 1 can be provided while suppressing the enlargement in the body size.

In the present embodiment, the protruding tube portions 22a and 22b of the cooling tube 2X are fitted into the through holes 37 and 38 of the plate 30A so that the plate 30 and the cooling tube 2X are connected together. Therefore, the plate 30 and the cooling tube 2X can be integrated. This configuration can reduce the number of components.

In particular, no complicated bellows pipe is used in order to connect the plate 30 and the cooling tube 2X in the present embodiment. Therefore, the number of components can be reduced significantly.

In the present embodiment, the diaphragm 23 of the cooling tube 2X located closer to the plate 30 is deformed when shrinking the cooling tube 2 in the tube stacking direction DRst. Therefore, the cooling tube 2X can reliably adhere to the plate 30 without bending the cooling tube 2X.

Second Embodiment

According to the above-described first embodiment, the dimension between adjacent two of the cooling tubes 2 is decreased by deforming the diaphragm 23. According to a second embodiment, the dimension between adjacent two of the cooling tubes 2 is decreased by deforming a bellows pipe instead.

Only the supply header 11 and the discharge header 12 are different between the cooler module 1 of the present embodiment and the cooler module 1 of the first embodiment, and the other configurations are the same. Accordingly, the supply header 11 and the discharge header 12 in the cooler module 1 of the present embodiment will be described.

Figure 9:
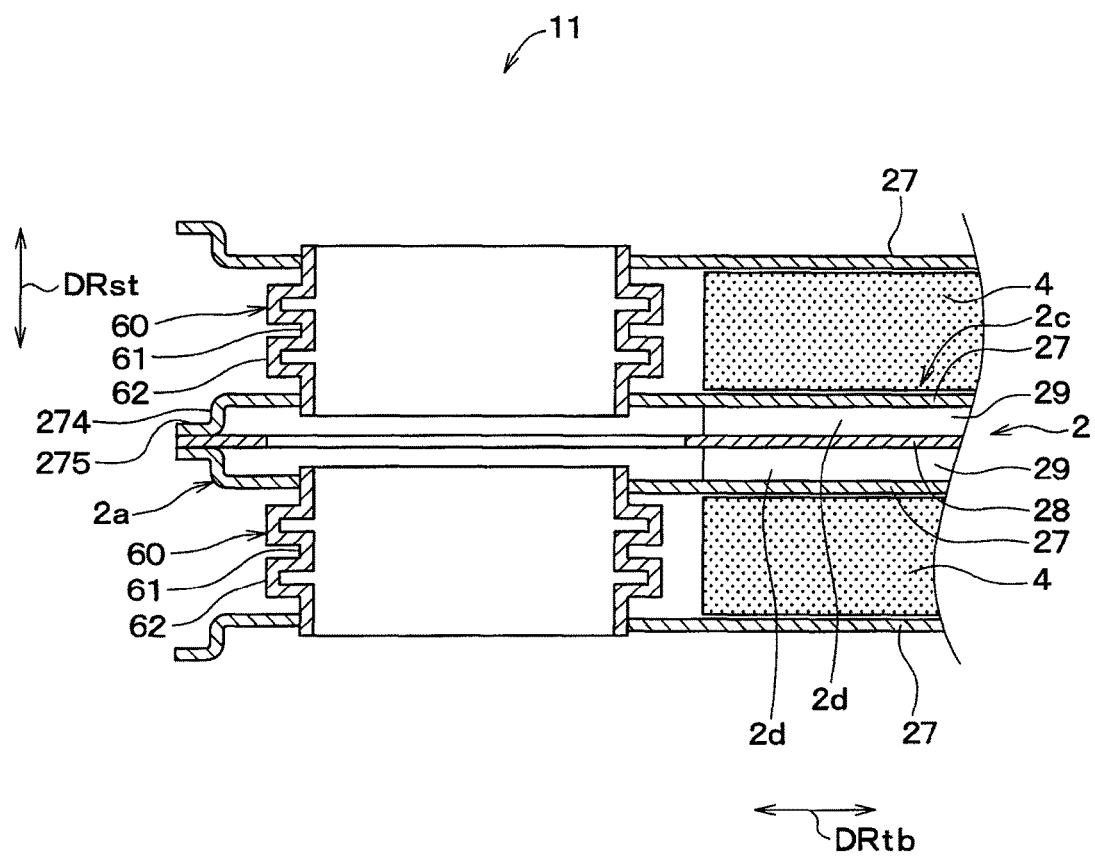
FIG. 9 is a cross-sectional view illustrating a portion of a cooler module in a second embodiment.

FIG. 9 illustrates a periphery of the supply header 11 of the cooler module 1 according to the present embodiment. The supply header 11 of the present embodiment has a bellows pipe 60, instead of the conduit configuring portion 224, between adjacent two of the cooling tubes 2. The bellows pipe 60 has an accordion shape and communicates between the adjacent two of the cooling tubes 2.

Specifically, the deformable portions 61 and 62 are arranged in the tube stacking direction DRst alternately one by one in the bellows pipe 60. The deformable portion 61 is formed so as to be recessed radially and inwardly around the axis of the supply header 11. The deformable portion 62 is formed so as to protrude radially and outwardly around the axis of the supply header 11.

The discharge header 12 of the present embodiment has the bellows pipe 60, instead of the conduit configuring portion 224, between adjacent two of the cooling tubes 2, similar to the supply header 11.

According to the above-described configuration of the present embodiment, the deformable portions 61, 62 of the bellows pipe 60 shrinks in the tube stacking direction DRst in the supply header 11 and the discharge header 12 when the cooler 10 is shrinks in the tube stacking direction DRst by pressing force. Consequently, the dimension between adjacent two of the cooling tubes 2 (i.e., between adjacent two of the heat exchange tube portions 2c) is decreased. That is, the bellows pipe 60 shrinks, and thereby the dimension between the adjacent two of the heat exchange tube portions 2c is decreased. As a result, the electronic component 4 is tightly in contact with each of the adjacent two of the heat exchange tube portions 2c and held between the adjacent two of the heat exchange tube portions 2c.

Thus, the cooler 10 is in a state of being subjected to pressure applied from the elastic member 50 in the tube stacking direction DRst between the elastic member 50 and the plate body 31.

According to the present embodiment, the plate 30 supports the longitudinal center portion of the cooling tube 2X in the tube longitudinal direction DRtb on a condition that the diaphragms 23, which are respectively provided in the base portions of the protruding tube portions 22a, 22b provided with the cooling tube 2X, are recessed toward the inside of the cooling tube 2X, similar to the above-described first embodiment. Therefore, the rigidity of the plate 30 for supporting the cooling tube 2 can be secured while the enlargement of the body size is suppressed.

According to the present embodiment, adjacent two of the cooling tubes 2 are connected to each other through the bellows pipe 60, provided instead of the conduit configuring portion 224, and thereby the supply header 11 is configured. Similarly, adjacent two of the cooling tubes 2 are connected to each other through the bellows pipe 60, provided instead of the conduit configuring portion 224, and thereby the discharge header 12 is configured. Therefore, similar to the above-described first embodiment, the dimension between the adjacent two of the heat exchange tube portions 2c is decreased, and thereby the electronic component 4 can be tightly in contact with each of the adjacent two of the heat exchange tube portions 2c, when the bellows pipe 60 shrinks.

Third Embodiment

In the first embodiment above, the example using one plate 30 for the cooler 10 has been described, but instead of this, an example using two plates (30A and 30B) for the cooler 10 will be described in the third embodiment.

Figure 10:
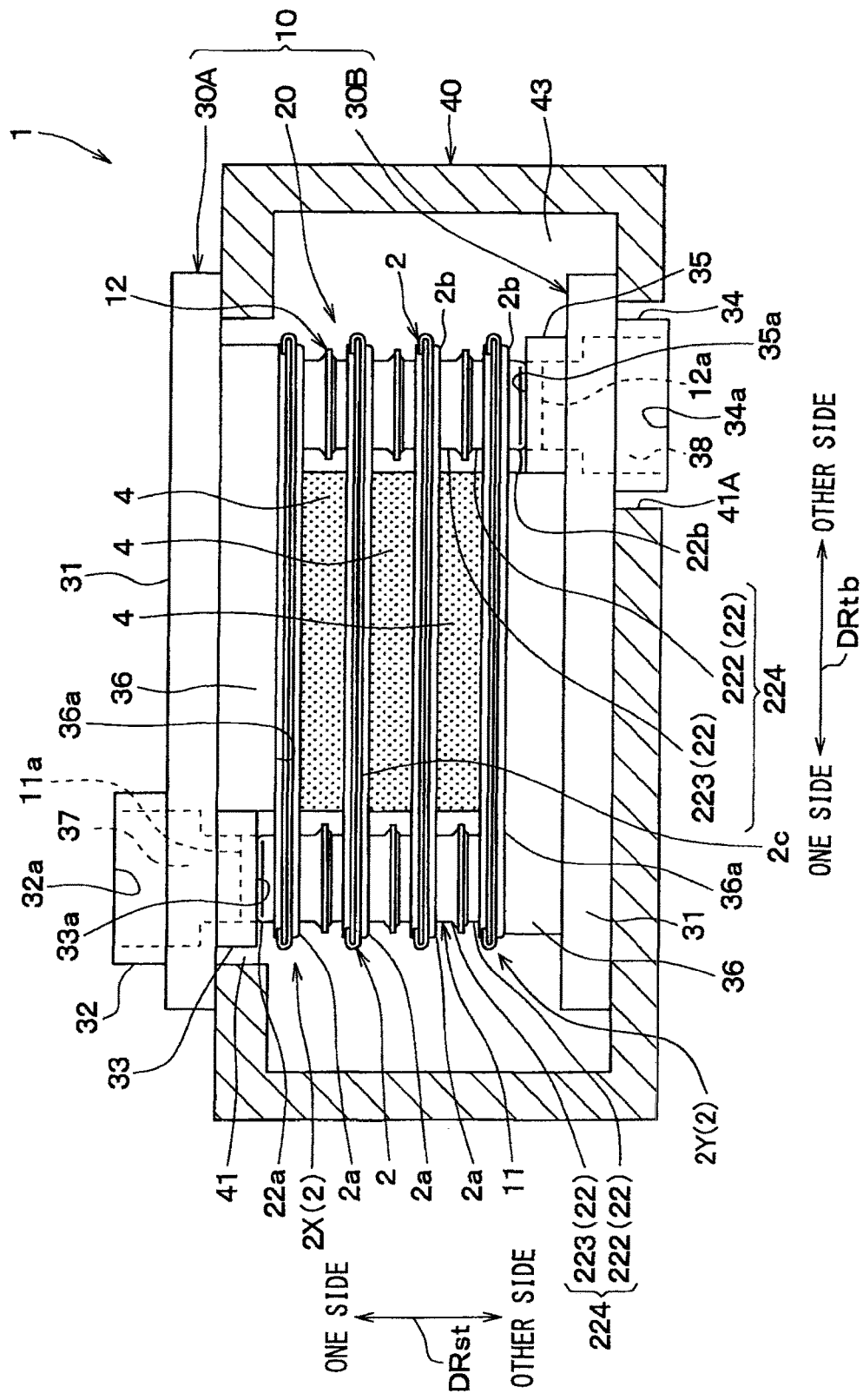
FIG. 10 is a cross-sectional view showing an overall structure of a cooler module in a third embodiment.

FIG. 10 is a cross-sectional view showing an overall configuration of the cooler module 1 of the present embodiment. In FIG. 10, the same reference numerals as in FIG. 1 denote the same component, and the description thereof is omitted.

The cooler module 1 includes a plate (i.e., a first support member) 30A and a plate (i.e., a second support member) 30B instead of the plate 30. The plate 30A is disposed on the one side of the body 20 in the tube stacking direction DRst. The plate 30B is disposed on the other side of the body 20 in the tube stacking direction DRst.

The plate 30A is provided with the protruding open sections 32, 33, the contact portion 36, and the through hole 37. The contact portion 36 has the contact surface 36a that is in contact with the cooling tube 2X, which is the one cooling tube of the cooling tubes 2 located at the one end in the tube stacking direction DRst. The protruding open sections 32 and 33 respectively configure openings 32a and 33a of the through hole 37 of the plate 30A.

The plate 30B is provided with the protruding open sections 34, 35, the contact portion 36, and the through hole 38. The contact portion 36 has the contact surface 36a that is in contact with a cooling tube 2Y, which is the other cooling tube of the cooling tubes 2 located at the other end in the tube stacking direction DRst. The protruding open sections 34 and 35 respectively configure the openings 34a and 35a of the through hole 37 of the plate 30B. For convenience of description, the reference numeral "2Y" is assigned to the other cooling tube of the cooling tubes 2 located at the other end in the tube stacking direction DRst, in order to distinguish the cooling tube 2Y from the other cooling tubes 2.

According to the present embodiment, the body 20 has the protruding tube portion 22a provided with the cooling tube 2X, which is located at the one end in the cooling tubes 2 in the tube stacking direction DRst. The protruding tube portion 22b is provided with the cooling tube 2Y, which is located at the other end in the cooling tubes 2 in the tube stacking direction DRst.

The protruding tube portion 22a of the body 20 is connected to the plate 30A by joining techniques such as brazing while being fitted into the through hole 37 of the plate 30A. The protruding tube portion 22b of the body 20 is connected to the plate 30B by joining techniques such as brazing while being fitted into the through hole 38 of the plate 30B.

In the present embodiment in which a configuration is made as described above, when the cooler 10 is shrunk in the tube stacking direction DRst by the pressing force, the diaphragms 23 of each outer shell plate 27 are respectively recessed toward the inside of the supply header configuring portion 2a and the discharge header configuring portion 2b at the supply header 11 and the discharge header 12.

For example, the diaphragm 23 provided with the base portion of the protruding tube portion 22a of the cooling tube 2X on the one side in the tube stacking direction DRst out of the cooling tubes 2 is recessed toward the inside of the cooling tube 2X by pressing force. For this reason, the contact surface 36a of the contact portion 36 of the plate 30A comes in contact with the center of the cooling tube 2X (i.e., heat exchange tube portion 2c) in the tube longitudinal direction DRtb and the other side in the tube longitudinal direction DRtb. Therefore, the contact surface 36a of the contact portion 36 of the plate 30A supports the center in the tube longitudinal direction DRtb and the other side in the tube longitudinal direction DRtb of the cooling tube 2X.

The cooling tube 2Y is provided with the protruding tube portion 22a that has a base portion provided with the diaphragm 23, and the diaphragm 23 is recessed toward an inside of the cooling tube 2Y by pressing force. As a result, the contact surface 36a of the contact portion 36 provided in the plate 30B is in contact with the longitudinal center portion (i.e., the heat exchange tube portion 2c) and the one longitudinal end portion of the cooling tube 2Y, which are respectively a center portion of the cooling tube 2Y in the tube longitudinal direction DRtb and an end portion of the cooling tube 2Y on the one side in the tube longitudinal direction DRtb. Thus, the contact surface 36a can support the longitudinal center portion and the one longitudinal end portion of the cooling tube 2Y.

According to the above present embodiment, since the diaphragm 23 provided with the base portion of the protruding tube portion 22a of the cooling tube 2X is recessed toward the inside of the cooling tube 2X, the plate 30A supports the center in the tube longitudinal direction DRtb and the other side in the tube longitudinal direction DRtb of the cooling tube 2X. Accordingly, without adopting the structure of the plate 30A protruding to the side opposite to the cooling tube 2X (the one side of the plate 30 in the tube stacking direction DRst), the thickness dimension La of the plate 30A can be sufficiently ensured.

Since the diaphragm 23 provided with the base portion of the protruding tube portion 22b of the cooling tube 2Y is recessed toward the inside of the cooling tube 2Y, the plate 30B supports the center in the tube longitudinal direction DRtb and the one side in the tube longitudinal direction DRtb of cooling tube 2Y. Accordingly, the thickness dimension La of the plate 30B can be sufficiently ensured without adopting the structure of the plate 30B protruding to the side opposite to the cooling tube 2X (the other side in the tube stacking direction DRst of the plate 30).

In this way, while suppressing an increase in the body size, the cooler module 1 ensuring the rigidity of the plates 30A and 30B supporting a cooling tube 2, and the method for manufacturing the cooler module 1 can be provided.

Fourth Embodiment

In the fourth embodiment, the cooling tubes 2 each formed in a U-shape are employed for the cooler module 1 of the first embodiment.

Figure 11:
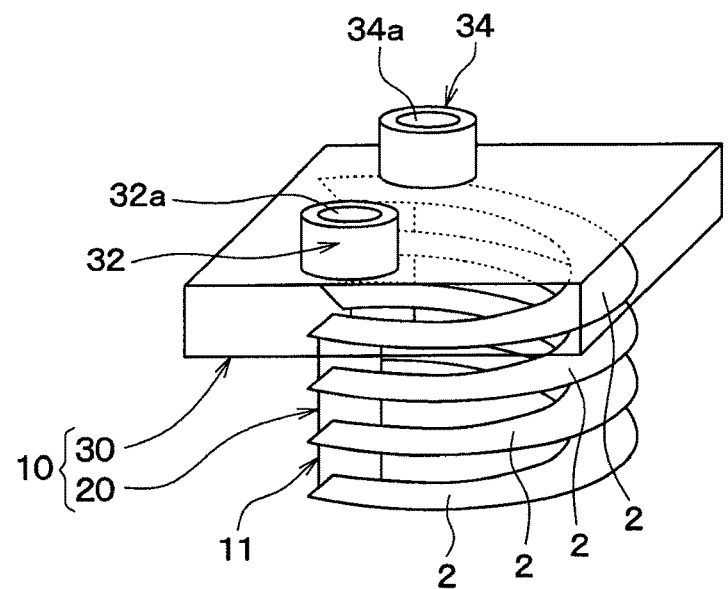
FIG. 11 is a perspective view showing the entire body of a cooler module in a fourth embodiment.
Figure 12:
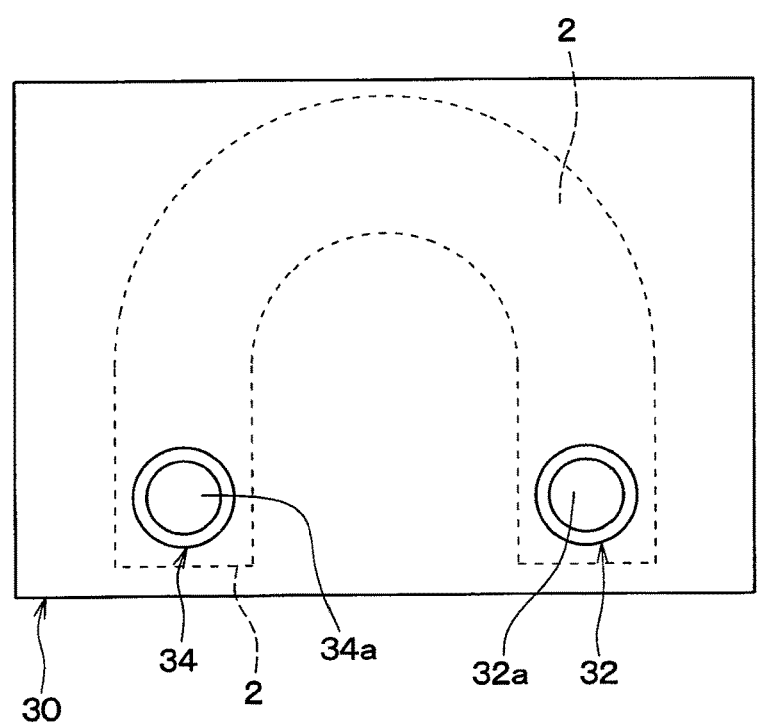
FIG. 12 is a top view showing a heat exchange tube portion of the cooler module in the fourth embodiment.

FIG. 11 is a perspective view showing an overall configuration of the cooler module 1 of the present embodiment. The case 40 is not shown in FIG. 11. FIG. 12 is a view illustrating the cooler module 1 viewed from the one side in the tube stacking direction DRst in FIG. 11. The same reference numerals as in FIG. 1 denote the same components in FIGS. 11 and 12, and description thereof is omitted.

In the cooler module 1 of the present embodiment, each of the cooling tubes 2 is formed in a U-shape when viewed from the one side in the tube stacking direction DRst.

Fifth Embodiment

The fifth embodiment will be described with reference to FIGS. 13 and 14. In the first embodiment, an example is described in which the plate 30 is disposed on the one side of the body 20 in the tube stacking direction DRst. In the fifth embodiment, a plate 30X (i.e., a support member) is disposed on the other side of the body 20 in the tube stacking direction DRst.

Figure 13:
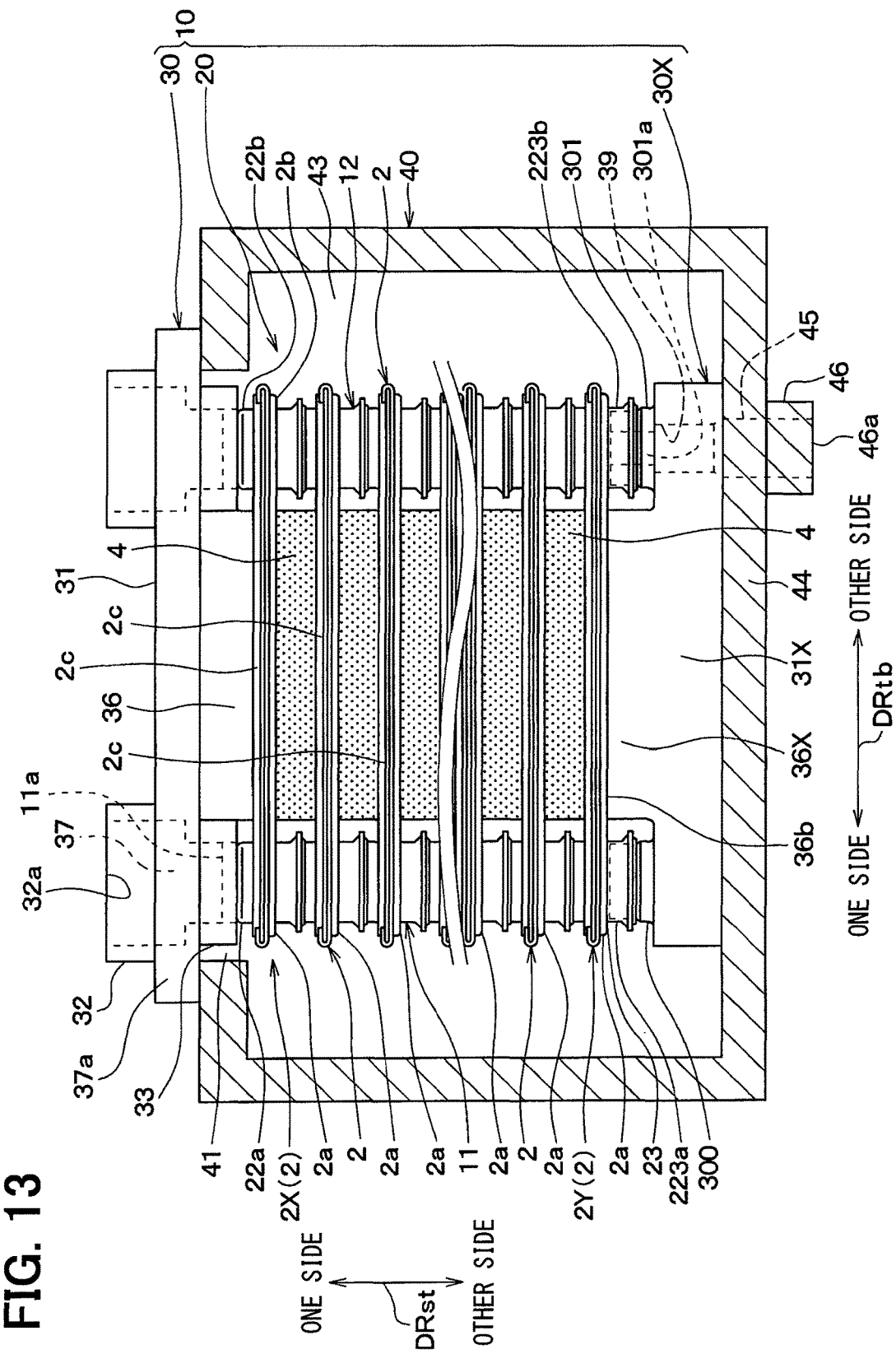
FIG. 13 is a cross-sectional view showing an overall configuration of a cooler module according to a fifth embodiment.
Figure 14:
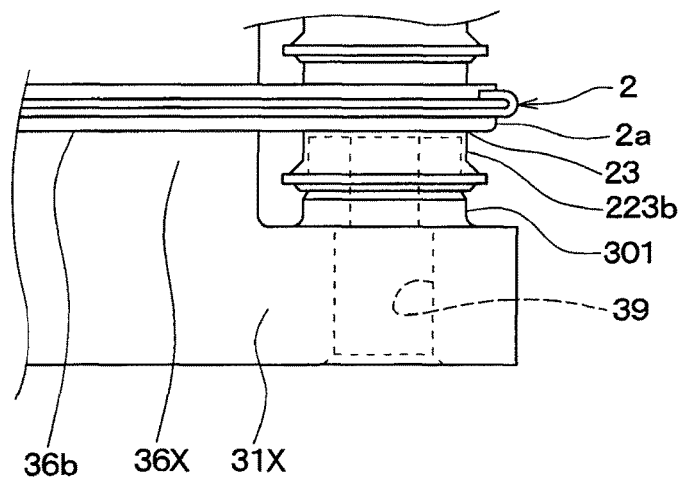
FIG. 14 is a partially enlarged view illustrating the cooler module in the fifth embodiment.

FIG. 13 is a perspective view showing an overall configuration of the cooler module 1 of the present embodiment. The same reference numerals as in FIG. 1 denote the same components in FIG. 13.

The cooler 10 of the present embodiment includes the plate 30X instead of the elastic member 50. In the cooler 10 of the present embodiment, large-diameter protruding tube portions 223a and 223b are added to the body 20 of the first embodiment. Therefore, the plate 30X and the large-diameter protruding tube portions 223a and 223b will be mainly described below.

The large-diameter protruding tube portions 223a and 223b are protruded from the other cooling tube, which is one of the cooling tubes 2 located at the other side in the tube stacking direction DRst, toward the other side in the tube stacking direction DRst. The other cooling tube, which is one of the cooling tubes 2 located at the other side in the tube stacking direction DRst, will be hereafter referred to as the cooling tube 2Y for the sake of convenience of description.

The large-diameter protruding tube portion 223a (i.e., the first protruding tube portion) protrudes to the other side in the tube stacking direction DRst from the one side in the tube longitudinal direction DRtb of the cooling tube 2Y. The large-diameter protruding tube portion 223a communicates with the supply header configuring portion 2a.

The large-diameter protruding tube portion 223b (i.e., the second protruding tube portion) protrudes to the other side in the tube stacking direction DRst from the other side of the tube longitudinal direction DRtb of the cooling tube 2Y. The large-diameter protruding tube portion 223b communicates with the discharge header configuring portion 2b.

The large-diameter protruding tube portions 223a and 223b are formed in the same manner as the large-diameter protruding tube portion 223 of the first embodiment.

Here, the diaphragm 23 is provided with the base portion of the large-diameter protruding tube portion 223a of the cooling tube 2Y. The diaphragm 23 is provided with the base portion of the large-diameter protruding tube portion 223b of the cooling tube 2Y.

The plate 30X is held between the body 20 and a bottom 44 of the case 40. The plate 30X includes a plate body 31X, a contact portion 36X, and first and second protruding support portions 300 and 301.

The plate body 31X is formed in a long-plate shape so as to extend in the tube longitudinal direction DRtb. The contact portion 36X is formed so as to protrude to the one side in the tube stacking direction DRst from the plate body 31X. The contact portion 36X configures a contact surface 36b in contact with an area extending in the tube longitudinal direction DRtb on the longitudinal center portion of the cooling tube 2Y.

The first protruding support portion 300 (i.e., the first fitting portion) is located on the one side of the contact portion 36X in the tube longitudinal direction DRtb. The first protruding support portion 300 protrudes from the plate body 31X toward the large-diameter protruding tube portion 223a. The first protruding support portion 300 is fitted into the large-diameter protruding tube portion 223a.

In the present embodiment, while being fitted into the large-diameter protruding tube portion 223a, the first protruding support portion 300 is connected to the large-diameter protruding tube portion 223a by joining techniques such as brazing. The first protruding support portion 300 functions as a plug to close the large-diameter protruding tube portion 223a.

The second protruding support portion 301 (i.e., the second fitting portion) is located on the other side of the contact portion 36X in the tube longitudinal direction DRtb. The second protruding support portion 301 protrudes from the plate body 31X toward the large-diameter protruding tube portion 223b. The second protruding support portion 301 is fitted into the large-diameter protruding tube portion 223b.

In the present embodiment, while being fitted into the large-diameter protruding tube portion 223b, the second protruding support portion 301 is connected to the large-diameter protruding tube portion 223b by a joining technique such as brazing.

The second protruding support portion 301 of the present embodiment is formed in a tubular shape having a through hole 39 communicating between the through holes 39 in the large-diameter protruding tube portion 223b and the plate 30X. The through hole 39 extends through the plate 30X in the tube stacking direction DRst. The through hole 39 communicates with a through hole 45 of the case 40. The through hole 45 forms an opening 46a in the protruding open section 46 of the case 40 by penetrating through the bottom 44 of the case 40 in the tube stacking direction DRst. The protruding open section 46 protrudes from the bottom of the case 40 to the other side in the tube stacking direction DRst. A pipe (not shown) is connected to the opening 46a.

Sixth Embodiment

In the sixth embodiment, an example in which tube parts 70A and 70B are provided to the plate 30 in the cooler module 1 of the first embodiment described above will be described.

Figure 15:
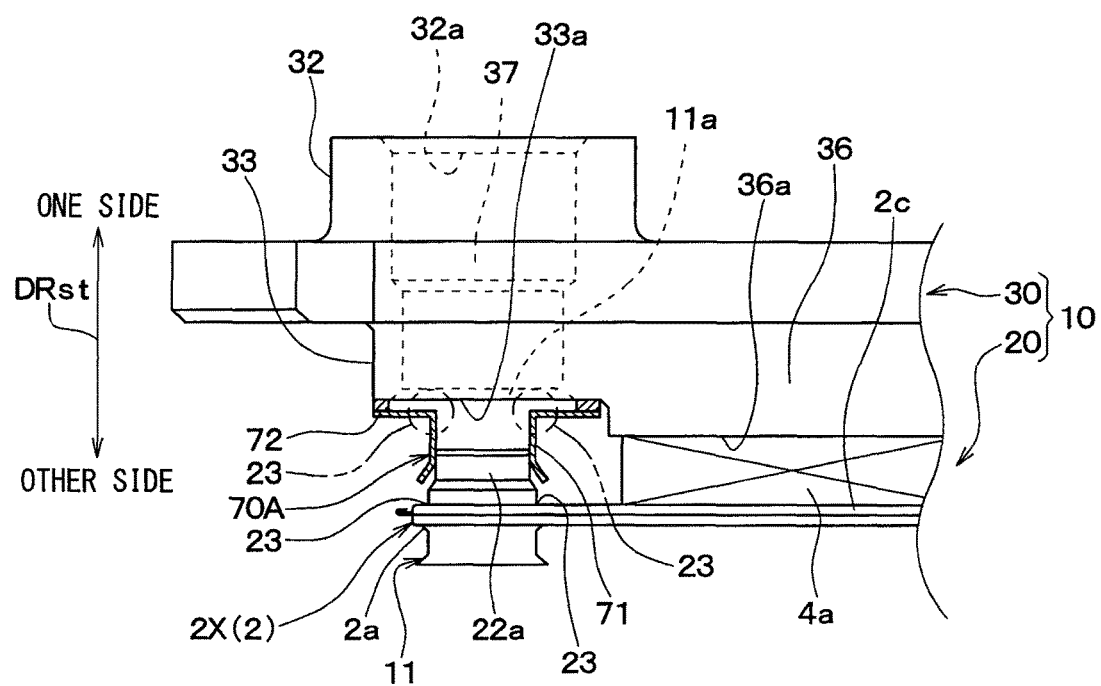
FIG. 15 is a partially enlarged view illustrating a cooler module in a sixth embodiment.

FIG. 15 shows a partial enlarged view near the refrigerant inlet 11a of the supply header 11 of the cooler module 1 of the present embodiment.

In the cooler module 1 of the present embodiment, a tube part 70A (i.e., the first fitting portion) is added to the cooler module 1 of the first embodiment described above.

The tube part 70A is arranged between the protruding open section 33 of the plate 30 and the protruding tube portion 22a. Specifically, the tube part 70A is formed so as to protrude toward the protruding tube portion 22a from the end of the protruding open section 33 of the plate 30. To be more specific, the tube part 70A is provided with a piping 71 and a flange 72. The piping 71 is a piping having an inlet 71a and an outlet 71b (refer to FIGS. 16A and 16B).

Figure 16A:
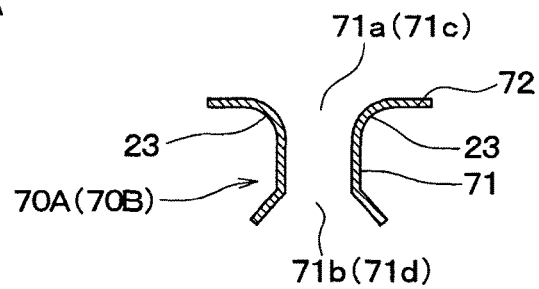
FIG. 16A is a partially enlarged view illustrating the cooler module in the sixth embodiment.
Figure 16B:
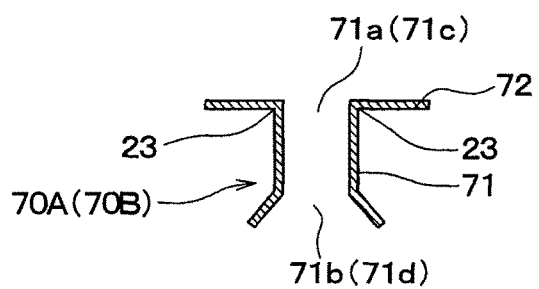
FIG. 16B is a partially enlarged view illustrating the cooler module in the sixth embodiment.

The inlet 71a and outlet 71b of the piping 71 in FIGS. 16A and 16B are communicated with the opening 33a of the protruding open section 33. The flange 72 is formed so as to protrude in an annular shape radially and outwardly from the inlet 71a of the piping 71. The flange 72 of the present embodiment is joined on the end of the protruding open section 33 by brazing or the like.

The tube part 70A configured as described above has the diaphragm 23 (i.e., a third flexible portion), which is formed in an annular shape, on a side adjacent to the plate 30 (i.e., adjacent to the flange 72). The diaphragm 23 is recessed toward the protruding open section 33 (i.e., the plate 30) in the tube part 70A. Similar to the above-described first embodiment, the diaphragm 23 of the present embodiment configures the flexible portion that can be deformed easily by pressing force in the tube stacking direction DRst in assembling the cooler module 1. The protruding tube portion 22a of the cooling tube 2X is fitted into the outlet 71b of the tube part 70A. The tube part 70A and the protruding tube portion 22a are joined by a method such as brazing. The cooling tube 2X is the one cooling tube of the cooling tubes 2 located at the one end in the tube stacking direction DRst.

Figure 17:
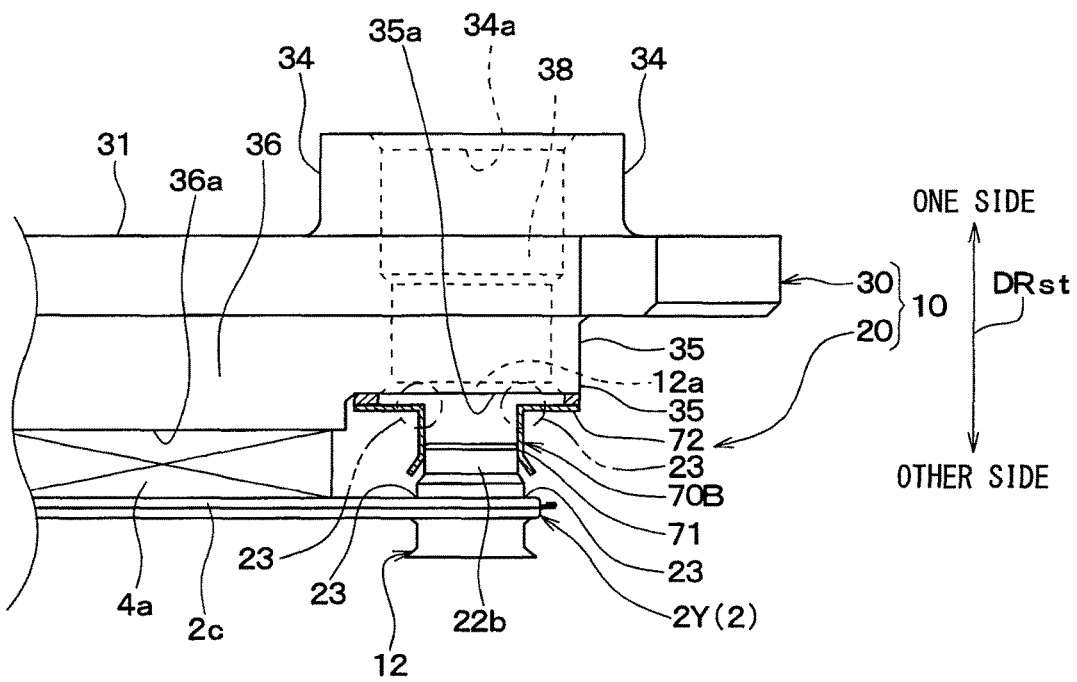
FIG. 17 is a partially enlarged view illustrating the cooler module in the sixth embodiment.

Furthermore, the cooler module 1 of the present embodiment is provided with the tube part 70B (i.e., the second fitting portion) as shown in FIG. 17.

The tube part 70B is arranged between the protruding open section 35 at the flange 72 and the protruding tube portion 22b. Specifically, the tube part 70B is formed so as to protrude toward the protruding tube portion 22b from the front end of the protruding open section 35 at the flange 72.

To be more specific, the tube part 70B, similarly to the tube part 70A, includes the piping 71 and the flange 72. The piping 71 is a piping having an inlet 71d and an outlet 71c. The inlet 71d and the outlet 71c of the piping 71 in FIGS. 16A and 16B communicate with the opening 35a of the protruding open section 35. The flange 72 is formed in an annular shape so as to protrude radially and outwardly from the inlet 71d of the piping 71. The flange 72 of the present embodiment is joined on the end of the protruding open section 33 by brazing or the like.

The tube part 70B configured as described above has the diaphragm 23 (i.e., a fourth flexible portion), which is formed in an annular shape, on the side adjacent to the plate 30 (i.e., adjacent to the flange 72). The diaphragm 23 is recessed toward the plate 30 (i.e., the protruding open section 35) in the tube part 70B. The diaphragm 23 of the present embodiment, as in the first embodiment, configures an flexible portion which can be easily deformed by pressing force in the tube stacking direction DRst at the time of assembling the cooler module 1. The protruding tube portion 22*b* of the cooling tube 2X is fitted into the inlet 71*d* of the tube part 70B. The tube part 70B and the protruding tube portion 22*b* of the cooling tube 2X are joined together by brazing or the like.

According to the above-described configuration according to the present embodiment, the electronic component 4*a* as the cooling target is arranged between the contact portion 36 of the plate 30 and the cooling tube 2X. The cooling tube 2X is the one cooling tube of the cooling tubes 2 located at the one end in the tube stacking direction.

The tube parts 70A and 70B of the present embodiment each have a thickness t set to be smaller than or equal to 1.0 mm, and the thickness t is preferably smaller than or equal to 0.4 mm.

According to the embodiment described above, the tube parts 70A and 70B are added between the plate 30 and the protruding tube portions 22*a* and 22*b* of the cooler 10. The tube parts 70A and 70B are each provided with the diaphragm 23.

The protruding tube portions 22*a* and 22*b* of the cooling tube 2X are each provided with the diaphragm 23 as in the first embodiment.

Therefore, the cooler 10 is shrunk in the tube stacking direction DRst in the assembly process of the cooler module 1. Then, as in the first embodiment, the pressing force is given to the diaphragm 23 of each outer shell plate 27 through the protruding tube portion 22. Therefore, the diaphragm 23 of each outer shell plate 27 is recessed by the pressing force toward the inside of the supply header configuring portion 2*a* and the discharge header configuring portion 2*b* in the supply header configuring portion 2*a* and the discharge header configuring portion 2*b*.

Further, the pressing force is given to the diaphragm 23 of the tube part 70A. The diaphragm 23 is recessed toward an opening 33*a* (i.e., plate 30) of the protruding open section 33. In addition, the pressing force is given to the diaphragm 23 of the tube part 70B. The diaphragm 23 is recessed toward the opening 35*a* (i.e., plate 30) of the protruding open section 35.

Thus, the dimension between the plate 30 and the cooling tube 2X can be reduced further. Therefore, the electronic component 4*a* and the contact portion 36 of the plate 30 can adhere to each other securely, and in addition, the electronic component 4*a* and the cooling tube 2X can adhere to each other securely.

Figure 18:
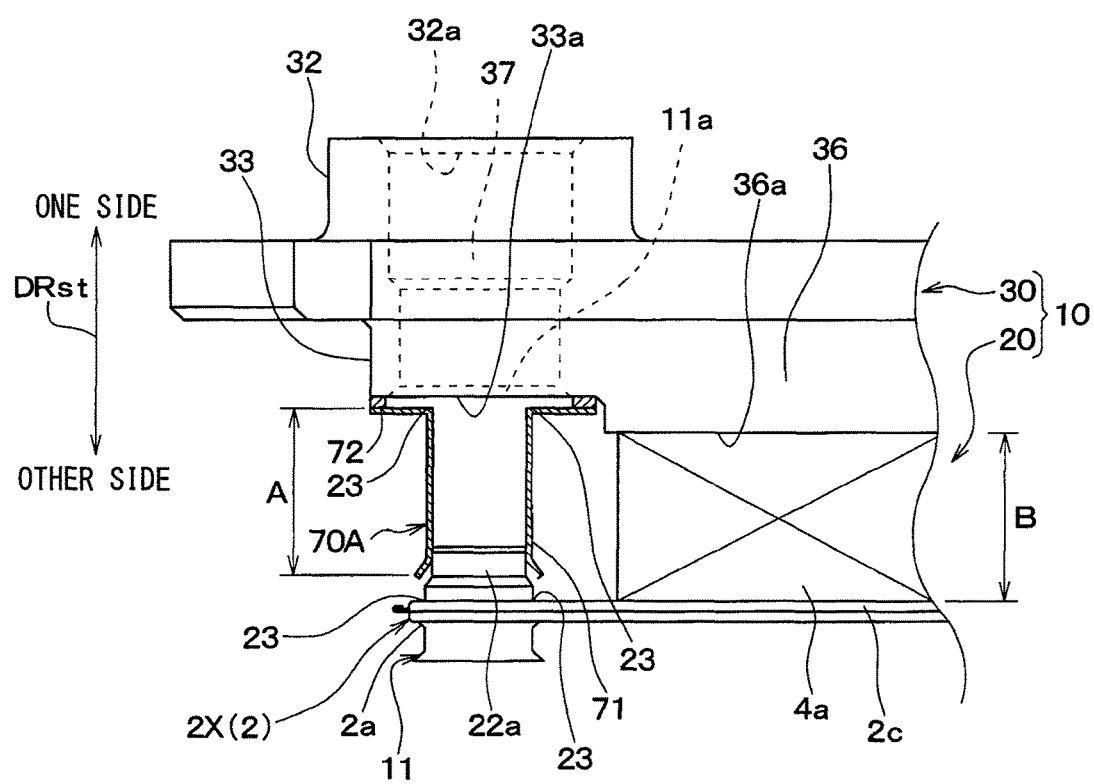
FIG. 18 is a partially enlarged view illustrating a cooler module according to a modification in the sixth embodiment.

Here, by adjusting the dimension A of the tube parts 70A and 70B in the tube stacking direction DRst in accordance with a dimension B of the electronic component 4*a* in the tube stacking direction DRst, an electronic component 4*a* having a large dimension B can be arranged between the contact portion 36 of the plate 30 and the cooling tube 2X (refer to FIG. 18).

Seventh Embodiment

Figure 19:
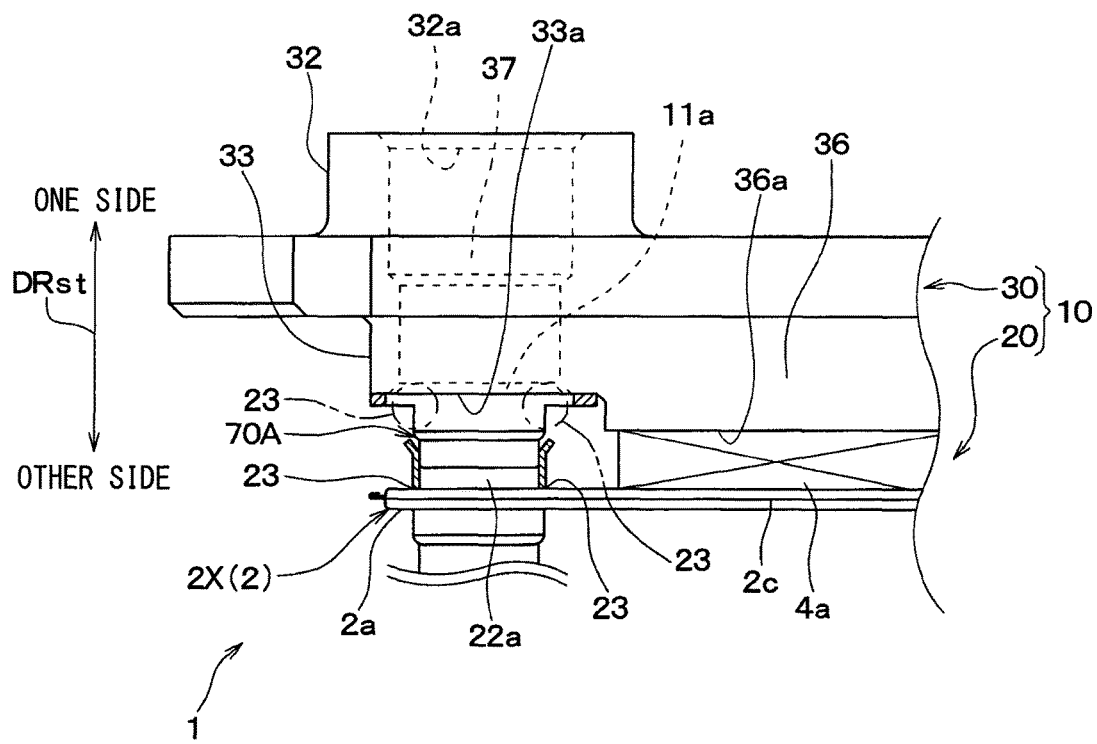
FIG. 19 is a partially enlarged view illustrating a cooler module in a seventh embodiment.

In the sixth embodiment described above, an example has been described in which the protruding tube portion 22*a* of the cooling tube 2X is fitted into the outlet 71*b* of the tube part 70A; however instead of this, the tube part 70A may be fitted into the protruding tube portion 22*a* of the cooling tube 2X as shown in FIG. 19. In this case, while the tube part 70A is fitted into the protruding tube portion 22*a* of the cooling tube 2X, the tube part 70A and the protruding tube portion 22*a* of the cooling tube 2X are joined together by brazing.

Similarly, although it is not shown, the tube part 70B may be fitted into the protruding tube portion 22*b* of the cooling tube 2Y. In this case also, while the tube part 70B is fitted into the protruding tube portion 22*b* of the cooling tube 2X, the tube part 70B and the protruding tube portion 22*b* of the cooling tube 2Y are joined together by brazing.

Other Embodiments

In the above first to fifth embodiments, an example has been described in which the cooler of the present disclosure is a stack-type cooler for an automobile; however instead of this, the cooler of the present disclosure may be used as a cooler other than the stack-type cooler for an automobile.

In the sixth embodiment, the example in which the tube parts 70A and 70B are joined to the cooler module 1 of the first embodiment has been described; however instead of this, the tube part 70A may be joined to the plate 30A and the tube part 70B may be joined to the plate 30B in the cooler module in the third embodiment.

In this case, similarly to the above sixth embodiment, the tube part 70A and the protruding tube portion 22*a* of the cooling tube 2X are joined together by brazing or the like while the protruding tube portion 22*a* of the cooling tube 2X is fitted into the tube part 70A. The tube part 70B and the protruding tube portion 22*b* of the cooling tube 2Y are joined together by brazing or the like while the protruding tube portion 22*b* of the cooling tube 2Y is fitted into the tube part 70B.

Figure 20:
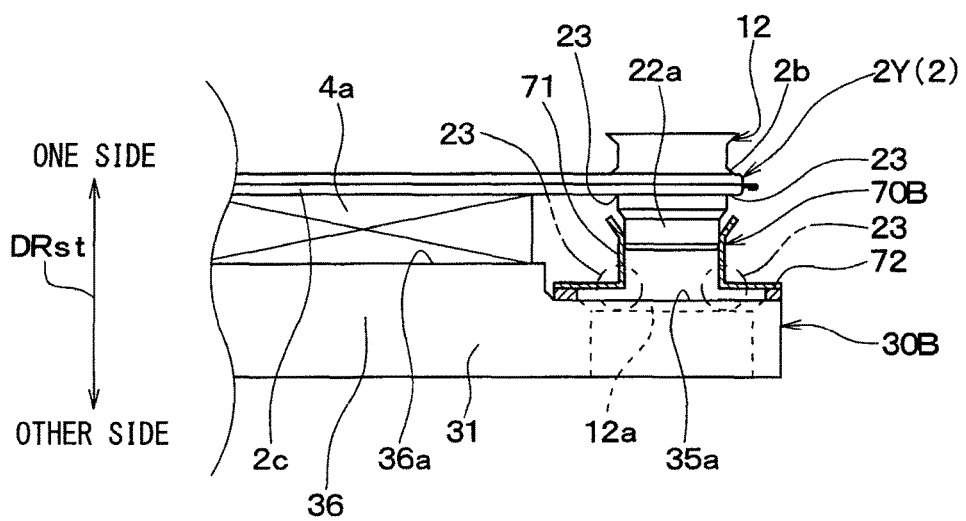
FIG. 20 is a partially enlarged view illustrating a cooler module in another embodiment.

As described above, the electronic component 4*a* may be arranged between the plate 30A and the cooling tube 2X. Similarly, the electronic component 4*a* may be arranged between the plate 30B and the cooling tube 2Y (refer to FIG. 20). The cooling tube 2Y is the other cooling tube of the cooling tubes 2 located at the other end in the tube stacking direction DRst.

In this case, the cooler 10 is shrunk in the tube stacking direction DRst in the assembly process of the cooler module 1. Then, as in the first embodiment, the diaphragm 23 of each outer shell plate 27 is recessed toward the inside of the supply header configuring portion 2*a* and the discharge header configuring portion 2*b* by the pressing force at the supply header configuring portion 2*a* and the discharge header configuring portion 2*b*.

In addition, the diaphragm 23 of the tube part 70A is recessed toward the opening 33*a* of the protruding open section 33 (i.e., toward the plate 30A) by pressing force. In addition to this, the diaphragm 23 of the tube part 70B is recessed toward the opening 35*a* of the protruding open section 35 (i.e., toward the plate 30B) by pressing force.

Thus, the dimension between the plate 30A and the cooling tube 2X can be reduced further. The dimension between the plate 30B and the cooling tube 2Y can be reduced further. Therefore, the contact portion 36 of the plate 30A and the electronic component 4*a* can be brought into close contact with each other, and in addition, the electronic component 4*a* and the cooling tube 2X can be brought into close contact with each other. The contact portion 36 of the plate 30B and the electronic component 4*a* can be brought into close contact with each other, and in addition, the electronic component 4*a* and the cooling tube 2X can be brought into close contact with each other.

In the above first to seventh embodiments, an example in which the cooling target according to the present disclosure is the electronic component 4 has been described; however instead of this, the cooling target according to the present disclosure may be a cooling target other than the electronic component 4.

According to the above-described first through seventh embodiment, the cooler module of the present disclosure is used for a power converter that converts DC power to AC power, however may be used for a power converter that converts AC power to DC power. The cooler of the present disclosure may be a power converter that converts DC power to AC power and converts AC power to DC power. Alternatively, the cooler of the present disclosure may be applied to a device other than the power converter.

According to the above-described first through seventh embodiments, the cooler 10 of the present disclosure has the electronic component 4 that is arranged between adjacent two of the cooling tubes 2. However, more than one of electronic components 4 may be arranged along a single cooling tube 2 such that the more than one of electronic components 4 is cooled by refrigerant flowing in the single cooling tube 2.

According to the above-described third embodiment, the plate 30A is fixed to the case 40 on a condition that the cooling tubes 2 and the plate 30B are housed in the case 40 and that the plate 30A closes the opening 41 of the case 40. However, this example may be replaced as follows.

That is, the plate 30B may be fixed to the case 40 on a condition that the cooling tubes 2 and the plate 30A are housed in the case 40 and that the plate 30B closes the opening 41 of the case 40.

Figure 21:
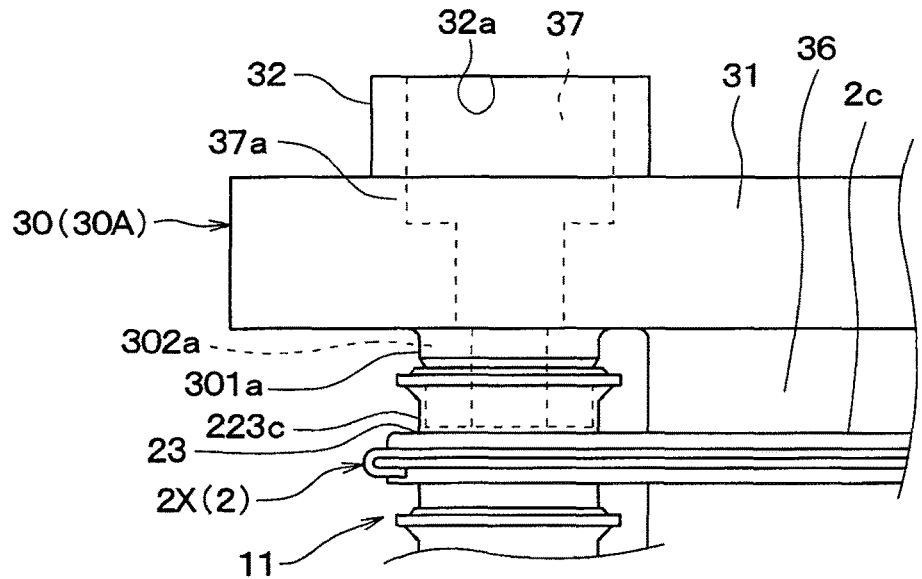
FIG. 21 is a partially enlarged view illustrating a cooler module in another embodiment.

In the first to seventh embodiments described above, an example has been described in which the protruding tube portion 22a is fitted into the through hole 37 of the plate 30 (e.g., the plate 30A) so as to fit the protruding tube portion 22a and the plate 30 (e.g., the plate 30A) together, but instead of this, the configuration may be as shown in FIG. 21.

That is, the plate 30 (i.e., the plate 30A) may be provided with a protruding support portion 301a. The plate 30 (e.g., the plate 30A) and a large-diameter protruding tube portion 223c are fitted together by fitting the protruding support portion 301a into the large-diameter protruding tube portion 223c. In this case, the protruding support portion 301a is joined to the large-diameter protruding tube portion 223c by a method such as brazing, on a condition that the protruding support portion 301a is fitted into the large-diameter protruding tube portion 223c.

The protruding support portion 301a is formed to have a tube shape that has a through hole 302a communicating with the through hole 37 of the plate 30 (e.g., the plate 30A). The inside of the supply header 11 and the through hole 37 communicate with each other through the protruding support portion 301a by fitting the protruding support portion 301a into the large-diameter protruding tube portion 223c. The large-diameter protruding tube portion 223c is provided with the cooling tube 2X, which is the one cooling tube of the cooling tubes 2 located at the one end in the tube stacking direction DRst, instead of the protruding tube portion 22a shown in FIG. 1.

Figure 22:
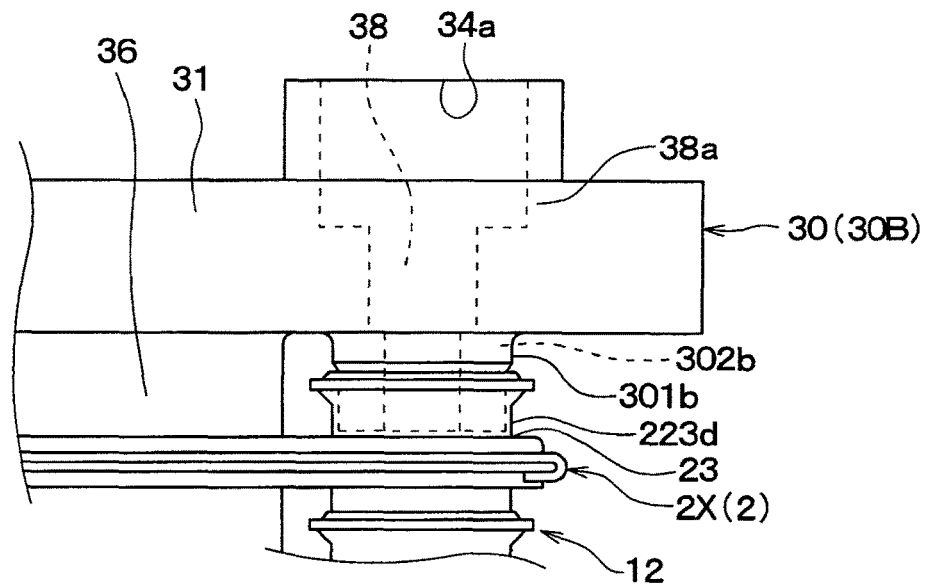
FIG. 22 is a partially enlarged view illustrating a cooler module in another embodiment.
Figure 23:
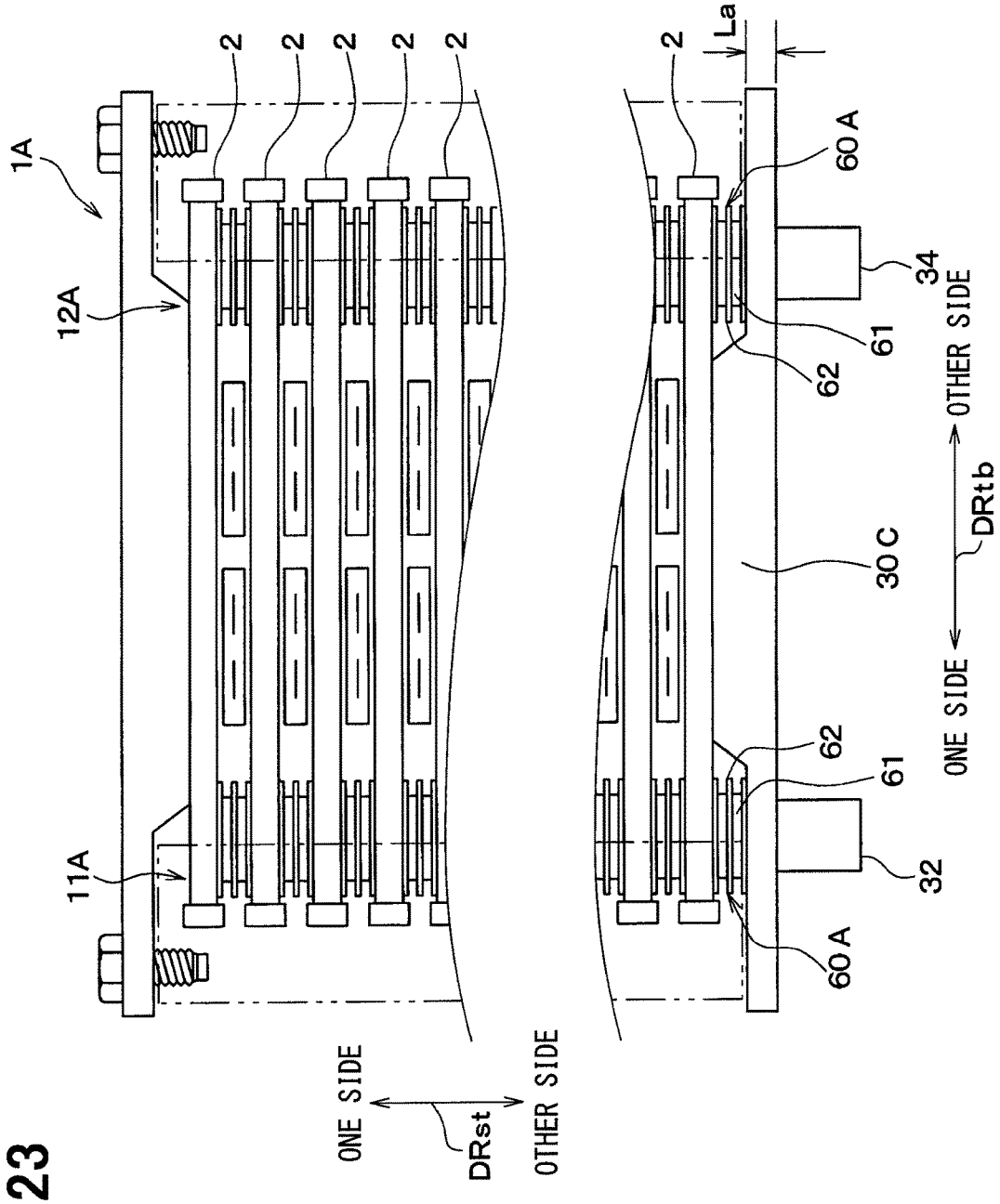
FIG. 23 is an overall view illustrating a cooler module in a comparative example.

The above first to seventh embodiments, the examples in which the protruding tube portion 22b and the plate 30 (e.g., the plate 30B) are fitted together by fitting the protruding tube portion 22b into the through hole 38 of the plate 30 (e.g., the plate 30B) has been described, but instead of this, the configuration as shown in FIG. 22 may be employed.

That is, the plate 30 (i.e., the plate 30B) may be provided with a protruding support portion 301b. The plate 30 (e.g., the plate 30B) and a large-diameter protruding tube portion 223d are fitted together by fitting the protruding support portion 301b into the large-diameter protruding tube portion 223d. In this case, the protruding support portion 301b is joined to the large-diameter protruding tube portion 223d by a method such as brazing, on a condition that the protruding support portion 301b is fitted into the large-diameter protruding tube portion 223d.

The protruding support portion 301b is formed to have a tube shape that has a through hole 302b communicating with the through hole 38 of the plate 30 (e.g., the plate 30B). The inside of the discharge header 12 and the through hole 38 communicate with each other through the protruding support portion 301b by fitting the protruding support portion 301b into the large-diameter protruding tube portion 223d. The large-diameter protruding tube portion 223d is provided with the cooling tube 2X instead of the protruding tube portion 22b shown in FIG. 1.

In addition, the above-described third embodiment may be modified to have the protruding support portion 301b in the plate 30B as well. In this case, the protruding tube portion 22b and the plate 30B are fitted together by fitting the protruding support portion 301b into the protruding tube portion 22b.

The present disclosure is not limited to the above-described embodiments and can be modified within the scope of the present disclosure. The above-described embodiments are not unrelated to each other and can be combined with each other except for a case where the combination is clearly improper. In the above-described embodiments, it is to be understood that elements constituting the embodiments are not necessary except for a case of being explicitly specified to be necessary and a case of being considered to be absolutely necessary in principle.

What is claimed is:
1. A cooler module comprising:
a case having an opening; and
a cooler having
a body that has a cooling tube and a cooling target arranged in a stacking direction, the body being housed in the case, and
a support member that is arranged on one side of the body in the stacking direction and closes the opening, the support member that supports a longitudinal center portion of the cooling tube, wherein
the cooling tube has
the longitudinal center portion configuring a heat exchange tube portion in which a refrigerant flows, the heat exchange tube portion that cools the cooling target by the refrigerant,
one longitudinal end portion configuring a refrigerant introduction portion that guides the refrigerant to the heat exchange tube portion, and
an other longitudinal end portion configuring a refrigerant discharge portion that discharges the refrigerant flowing from the heat exchange tube portion,
the one longitudinal end portion is provided with a first protruding tube portion communicating with the refrigerant introduction portion and protruding toward the one side in the stacking direction,
the other longitudinal portion is provided with a second protruding tube portion communicating with the refrigerant discharge portion and protruding toward the one side in the stacking direction,
the first protruding tube portion has a base portion that is provided with a first flexible portion formed in an annular shape, the second protruding tube portion has a base portion that is provided with a second flexible portion is formed in an annular shape, the support member has
- a first fitting portion fitted to the first protruding tube portion and
- a second fitting portion fitted to the second protruding tube portion, and the support member supports the longitudinal center portion, on a condition that the first fitting portion and the first protruding tube portion are fitted together, the second fitting portion and the second protruding tube portion are fitted together, and the first flexible portion and the second flexible portion are recessed toward an inside of the cooling tube.

2. The cooler module according to claim 1, wherein
the first fitting portion is arranged between the support member and the first protruding tube portion,
the second fitting portion is arranged between the support member and the second protruding tube portion,
the first fitting portion is provided with a third flexible portion formed in an annular shape,
the second fitting portion is provided with a fourth flexible portion formed in an annular shape, and
the support member supports the longitudinal center portion on a condition that the first protruding tube portion and the first fitting portion are fitted together, the second protruding tube portion and the second fitting portion are fitted together, and the third flexible portion and the fourth flexible portion are recessed toward the support member.

3. The cooler module according to claim 1, wherein
each of the first fitting portion and the second fitting portion is joined to the support member.

4. The cooler module according to claim 2, wherein
the cooling target is held between the support member and the cooling tube.

5. The cooler module according to claim 1, wherein
the first fitting portion is a first through-hole forming portion that provides a first through hole in which the first protruding tube portion is fitted, and
the second fitting portion is a second through-hole forming portion that provides a second through hole in which the second protruding tube portion is fitted.

6. The cooler module according to claim 1, wherein
the first fitting portion is a first protruding support portion that protrudes toward the first protruding tube portion and is fitted to the first protruding tube portion, and
the second fitting portion is a second protruding support portion that protrudes toward the second protruding tube portion and is fitted to the second protruding tube portion.

7. The cooler module according to claim 1, wherein
the cooling tube is one of a plurality of cooling tubes that are stacked in a stacking direction,
every adjacent two of the plurality of cooling tubes have the cooling target located therebetween,
the plurality of cooling tubes have the one longitudinal end portion that configures a supply header, the supply header being located between the every adjacent two cooling tubes and connecting the every adjacent two cooling tubes with each other, the supply header guides refrigerant to the heat exchange tube portion of each of the adjacent two cooling tubes,
the plurality of cooling tubes have the other longitudinal end portion that configures a discharge header, the discharge header being located between the every adjacent two cooling tubes and connecting the every adjacent two cooling tubes with each other, the discharge header that discharges the refrigerant flowing from the heat exchange tube portion of each of the every adjacent two cooling tubes,
the plurality of cooling tubes includes one cooling tube located at one end of the plurality of cooling tubes in the stacking direction, the one cooling tube being provided with the first protruding tube portion and the second protruding tube portion, and
the one cooling tube has the longitudinal center portion that is supported by the support member.

8. The cooler module according to claim 7, wherein
the support member is fixed to the case on a condition of closing the opening of the case.

9. The cooler module according to claim 1, wherein
the support member has
- a supply portion that supplies the refrigerant to the refrigerant introduction portion through the first protruding tube portion and
- a discharge portion that discharges the refrigerant, flowing from the refrigerant discharge portion, through the second protruding tube portion.

10. A cooler module comprising:
a case having an opening; and
a cooler having
- a body that has a plurality of cooling tubes stacked in a stacking direction and a cooling target, the body being housed in the case,
- a first support member that supports a longitudinal center portion of one cooling tube of the plurality of cooling tubes that is located at one end of the plurality of cooling tubes in the stacking direction, and
- a second support member that supports an other cooling tube of the plurality of cooling tubes that is located at an other end of the plurality of cooling tubes in the stacking direction, wherein every adjacent two cooling tubes of the plurality of cooling tubes have the cooling target located therebetween, each of the plurality of cooling tubes has
- a longitudinal center portion that configures a heat exchange tube portion in which a refrigerant flows, the heat exchange tube portion that cools the cooling target by the refrigerant,
- one longitudinal end portion that configures a supply header, the supply header being located between the every adjacent two cooling tubes and connecting the every adjacent two cooling tubes with each other, the supply header that guides refrigerant to the heat exchange tube portion of each of the every adjacent two cooling tubes, and
- an other longitudinal end portion that configures a discharge header, the discharge header being located between the every adjacent two cooling tubes and connecting the every adjacent two cooling tubes with each other, the discharge header that discharges the refrigerant flowing from the heat exchange tube portion of each of the every adjacent two cooling tubes, the one cooling tube has the one longitudinal end portion that is provided with a first protruding tube portion communicating with an inside of the supply header and the other cooling tube has the other longitudinal end portion that is provided with a second protruding tube portion communicating with an inside of the supply header, the first protruding tube portion has a base portion provided with a first flexible portion, the second protruding tube portion has a base portion provided with a second flexible portion, the first support member has a first fitting portion that is fitted to the first protruding tube portion, the second support member has a second fitting portion that is fitted to the second protruding tube portion, the first support member supports the longitudinal center portion of the one cooling tube on a condition that the first protruding tube portion and the first fitting portion are fitted together and that the first flexible portion is recessed toward an inside of the one cooling tube, and the second support member supports the other cooling tube on a condition that the second protruding tube portion and the second fitting portion are fitted together and that the second flexible portion is recessed toward an inside of the other cooling tube.

11. The cooler module according to claim 10, wherein
the first fitting portion is located between the first support member and the first protruding tube portion,
the second fitting portion is located between the second support member and the second protruding tube portion,
the first fitting portion is provided with a third flexible portion that is formed in an annular shape,
the second fitting portion is provided with a fourth flexible portion that is formed in an annular shape,
the first support member supports the one cooling tube on a condition that the first protruding tube portion and the first fitting portion are fitted together and that the third flexible portion is recessed toward the first support member, and
the second support member supports the other cooling tube on a condition that the second protruding tube portion and the second fitting portion are fitted together and that the fourth flexible portion is recessed toward the second support member.

12. The cooler module according to claim 10, wherein
the first fitting portion is joined to the first support member, and
the second fitting portion is joined to the second support member.

13. The cooler module according to claim 10, wherein
the cooling target is held between the one cooling tube and the first support member.

14. The cooler module according to claim 10, wherein
the cooling target is held between the other cooling tube and the second support member.

15. The cooler module according to claim 10, wherein
each of the first fitting portion and the second fitting portion is formed in a tubular shape and has a thickness dimension set to be smaller than or equal to 1.0 mm.

16. The cooler module according to claim 10, wherein
the first fitting portion is a first through-hole forming portion that provides a first through hole in which the first protruding tube portion is fitted; and
the second fitting portion is a second through-hole forming portion that provides a second through hole in which the second protruding tube portion is fitted.

17. The cooler module according to claim 10, wherein
the first fitting portion is a first protruding support portion that protrudes toward the first protruding tube portion and is fitted to the first protruding tube portion; and
the second fitting portion is a second protruding support portion that protrudes toward the second protruding tube portion and is fitted to the second protruding tube portion.

18. The cooler module according to claim 10, wherein
the case houses one of the first support member and the second support member,
an other of the first support member and the second support member is fixed to the case on a condition of closing the opening of the case.

19. The cooler module according to claim 10, wherein
the first support member is provided with a supply portion that supplies the refrigerant to the supply header through the first protruding tube portion, and
the second support member is provided with the discharge portion that discharges the refrigerant from the discharge header through the second protruding tube portion.

20. The cooler module according to claim 10, wherein
each of the supply header and the discharge header is configured to have a bellows pipe that connects the every adjacent two cooling tubes with each other, and
the every adjacent two cooling tubes are tightly in contact with the cooling target on a condition that the bellows pipe is shrunk in the stacking direction.

21. The cooler module according to claim 10, wherein
one of the every adjacent two cooling tubes has the one longitudinal end portion and the other longitudinal end portion that are respectively provided with third protruding tube portions protruding toward an other of the every adjacent two cooling tubes,
the other of the every adjacent two cooling tubes has the one longitudinal end portion and the other longitudinal end portion that are respectively provided with fourth protruding tube portions protruding toward the one of the every adjacent two cooling tubes,
the third protruding tube portion, which is provided with the one longitudinal end portion of the one of the every adjacent two cooling tubes, and the fourth protruding tube portion, which is provided with the one longitudinal end portion of the other of the every adjacent two cooling tubes, are fitted together and configure the supply header,
the third protruding tube portion, which is provided with the other longitudinal end portion of the one of the every adjacent two cooling tubes, and the fourth protruding tube portion, which is provided with the other longitudinal end portion of the other of the every adjacent two cooling tubes, are fitted together and configure the discharge header,
the third protruding tube portion, which is provided with the one longitudinal end portion of the one of the every adjacent two cooling tubes, is provided with a fifth flexible portion that is formed in an annular shape,
the third protruding tube portion, which is provided with the other longitudinal end portion of the one of the every adjacent two cooling tubes, is provided with a sixth flexible portion that is formed in an annular shape,
the fourth protruding tube portion, which is provided with the one longitudinal end portion of the other of the every adjacent two cooling tubes, is provided with a seventh flexible portion that is formed in an annular shape, the fourth protruding tube portion, which is provided with the other longitudinal end portion of the other of the every adjacent two cooling tubes, is provided with an eighth flexible portion that is formed in an annular shape, and the every adjacent two cooling tubes are tightly in contact with the cooling target on a condition that the fifth flexible portion and the sixth flexible portion are recessed toward an inside of the one of the every adjacent two cooling tubes and that the seventh flexible portion and the eighth flexible portion are recessed toward an inside of the other of the every adjacent two cooling tubes.

22. A method for manufacturing a cooler module, the cooler module having
    a case having an opening and
    a cooler,
    the cooler having
        a body that has a cooling tube and a cooling target arranged in a stacking direction, the body being housed in the case, and
        a support member that is located on one side of the body in the stacking direction and closes the opening, the support member that supports a longitudinal center portion of the cooling tube,
    the cooling tube having
        the longitudinal center portion configuring a heat exchange tube portion in which refrigerant flows, the heat exchange tube portion that cools the cooling target by the refrigerant,
        one longitudinal end portion configuring a refrigerant introduction portion that guides the refrigerant to the heat exchange tube portion,
        an other longitudinal end portion configuring a refrigerant discharge portion that discharges the refrigerant flowing from the heat exchange tube portion,
    the one longitudinal end portion being provided with a first protruding tube portion that communicates with the refrigerant introduction portion and protrudes toward the one side in the stacking direction,
    the other longitudinal end portion being provided with a second protruding tube portion that communicates with the refrigerant discharge portion and protrudes toward the one side in the stacking direction,
    the first protruding tube portion having a base portion that is provided with a first flexible portion formed in an annular shape,
    the second protruding tube portion having a base portion that is provided with a second flexible portion formed in an annular shape, and
    the support member that has a first fitting portion fitting to the first protruding tube portion and a second fitting portion fitting to the second protruding tube portion,
    the method for manufacturing the cooler module comprising:
        assembling the support member such that the first protruding tube portion and the first fitting portion are fitted together and that the second protruding tube portion and the second fitting portion are fitted together; and
        deforming the first flexible portion and the second flexible portion to be recessed toward an inside of the cooling tube such that the support member supports the longitudinal center portion.

23. A method for manufacturing a cooler module, the cooler module having
    a case having an opening and
    a cooler,
    the cooler having
        a body that has a plurality of cooling tubes stacked in a stacking direction and a cooling target, the body being housed in the case,
        a first support member that closes the opening and supports a longitudinal center portion of one cooling tube of the plurality of cooling tubes located at one end of the plurality of cooling tubes in the stacking direction, and
        a second support member that supports an other cooling tube of the plurality of cooling tubes that is located at an other end of the plurality of cooling tubes in the stacking direction,
    every adjacent two cooling tubes of the plurality of cooling tubes having the cooling target located therebetween,
    each of the plurality of cooling tubes having
        a longitudinal center portion that configures a heat exchange tube portion in which a refrigerant flows, the heat exchange tube portion that cools the cooling target by the refrigerant,
        one longitudinal end portion that configures a supply header, the supply header being located between the every adjacent two cooling tubes and connecting the every adjacent two cooling tubes with each other, the supply header that guides refrigerant to the heat exchange tube portion of each of the every adjacent two cooling tubes, and
        an other longitudinal end portion that configures a discharge header, the discharge header being located between the every adjacent two cooling tubes and connecting the every adjacent two cooling tubes with each other, the discharge header that discharges the refrigerant flowing from the heat exchange tube portion of each of the every adjacent two cooling tubes,
    the one cooling tube having the one longitudinal end portion that is provided with a first protruding tube portion communicating with an inside of the supply header and
    the other cooling tube having the other longitudinal end portion that is provided with a second protruding tube portion communicating with an inside of the supply header,
    the first protruding tube portion having a base portion that is provided with a first flexible portion,
    the second protruding tube portion having a base portion that is provided with a second flexible portion,
    the first support member having a first fitting portion that is fitted to the first protruding tube portion,
    the second support member having a second fitting portion that is fitted to the second protruding tube portion,
    the method for manufacturing the cooler module comprising:
        assembling the first support member and the second support member such that the first protruding tube portion and the first fitting portion are fitted together and that the second protruding tube portion and the second fitting portion are fitted together; and deforming the first flexible portion and the second flexible portion to be recessed toward an inside of the one cooling tube and an inside of the other cooling tube respectively, such that the first support member and the second support member support the one cooling tube and the other cooling tube respectively.

\* \* \* \* \*